(12) United States Patent
Yamazaki

(10) Patent No.: US 7,368,318 B2
(45) Date of Patent: May 6, 2008

(54) SEMICONDUCTOR DEVICE AND METHOD FOR MANUFACTURING THE SAME, AND ELECTRIC APPLIANCE

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 103 days.

(21) Appl. No.: 11/227,190

(22) Filed: Sep. 16, 2005

(65) Prior Publication Data

US 2006/0099738 A1     May 11, 2006

(30) Foreign Application Priority Data

Sep. 24, 2004   (JP)   ............... 2004-278548

(51) Int. Cl.
*H01L 21/00* (2006.01)
(52) U.S. Cl. ...................... 438/106; 438/114
(58) Field of Classification Search ............ 438/106, 438/110, 113, 114
See application file for complete search history.

(56) References Cited

U.S. PATENT DOCUMENTS

| | | |
|---|---|---|
| 5,166,556 A | 11/1992 | Hsu et al. |
| 5,198,831 A | 3/1993 | Burrell et al. |
| 5,403,700 A | 4/1995 | Heller et al. |
| 5,581,385 A | 12/1996 | Sppitzer et al. |
| 5,757,456 A | 5/1998 | Yamazaki et al. |
| 5,821,138 A | 10/1998 | Yamazaki et al. |
| 5,834,327 A | 11/1998 | Yamazaki et al. |
| 6,022,792 A | 2/2000 | Ishii et al. |
| 6,118,502 A | 9/2000 | Yamazaki et al. |
| 6,372,608 B1 | 4/2002 | Shimoda et al. |

(Continued)

FOREIGN PATENT DOCUMENTS

EP     1 193 759     4/2002

(Continued)

OTHER PUBLICATIONS

Search Report (Patent Cooperation Treaty Application No. PCT/JP2004/018978) dated Mar. 15, 2005.

(Continued)

*Primary Examiner*—David Mis
(74) *Attorney, Agent, or Firm*—Eric J. Robinson; Robinson Intellectual Property Law Office, P.C.

(57) ABSTRACT

The present invention provides a semiconductor device having a plurality of functions and a method for manufacturing the semiconductor device. The semiconductor device comprises a thin film integrated circuit, a first substrate having a sensor or an antenna, and a second substrate having an antenna, wherein the thin film integrated circuit is interposed between the first substrate having a sensor or an antenna and the second substrate having an antenna. In the case that the semiconductor device has a plurality of antennas and the semiconductor device communicates in different frequency bands, the semiconductor device can receive a plurality of frequency bands, and so the range of choice of the reader/writer is expanded. In the case that the semiconductor device has a sensor and an antenna, information detected by the sensor can be converted to signals and the signals can be output to a reader/writer via the antenna. Therefore, the semiconductor device is added with higher value than that of the conventional semiconductor device such as a wireless chip.

31 Claims, 27 Drawing Sheets

U.S. PATENT DOCUMENTS

| | | |
|---|---|---|
| 6,377,176 B1 | 4/2002 | Lee |
| 6,478,229 B1 | 11/2002 | Epstein |
| 6,509,217 B1 | 1/2003 | Reddy |
| 6,682,963 B2 | 1/2004 | Ishikawa |
| 6,781,152 B2 | 8/2004 | Yamazaki |
| 6,998,282 B1 | 2/2006 | Yamazaki et al. |
| 7,045,438 B2 | 5/2006 | Yamazaki et al. |
| 7,109,071 B2 | 9/2006 | Ishikawa |
| 7,122,445 B2 | 10/2006 | Takayama et al. |
| 7,282,380 B2 | 10/2007 | Maruyama et al. |
| 2001/0015256 A1 | 8/2001 | Yamazaki et al. |
| 2001/0053559 A1 | 12/2001 | Nagao et al. |
| 2002/0030189 A1 | 3/2002 | Ishikawa |
| 2003/0022403 A1 | 1/2003 | Shimoda et al. |
| 2003/0030689 A1 | 2/2003 | Hashimoto et al. |
| 2003/0032210 A1 | 2/2003 | Takayama et al. |
| 2003/0169204 A1 | 9/2003 | Saito |
| 2004/0128246 A1 | 7/2004 | Takayama et al. |
| 2004/0129450 A1 | 7/2004 | Yamazaki et al. |
| 2004/0129960 A1 | 7/2004 | Maruyama et al. |
| 2004/0132265 A1 | 7/2004 | Maruyama et al. |
| 2005/0023525 A1 | 2/2005 | Ishikawa |
| 2005/0045729 A1 | 3/2005 | Yamazaki |
| 2005/0051870 A1 | 3/2005 | Yamazaki et al. |
| 2005/0070038 A1 | 3/2005 | Yamazaki et al. |
| 2005/0130389 A1 | 6/2005 | Yamazaki et al. |
| 2005/0148121 A1 | 7/2005 | Yamazaki et al. |
| 2005/0168339 A1 | 8/2005 | Arai et al. |
| 2005/0192129 A1 | 9/2005 | Kuwabara |
| 2005/0210302 A1 | 9/2005 | Kato et al. |
| 2005/0214984 A1 | 9/2005 | Maruyama et al. |
| 2005/0287846 A1 | 12/2005 | Dozen et al. |
| 2006/0068536 A1 | 3/2006 | Yamazaki |
| 2006/0099738 A1* | 5/2006 | Yamazaki .................. 438/114 |
| 2006/0177972 A1 | 8/2006 | Takeuchi et al. |

FOREIGN PATENT DOCUMENTS

| | | |
|---|---|---|
| JP | 08-254686 | 10/1996 |
| JP | 2001-013874 | 1/2001 |
| JP | 2001-109866 | 4/2001 |
| JP | 2001-260580 | 9/2001 |
| JP | 2001-272923 | 10/2001 |
| JP | 2003203898 | 7/2003 |
| WO | WO 03/010825 | 2/2003 |
| WO | WO 2005/057658 | 6/2005 |
| WO | WO 2005/069204 | 7/2005 |
| WO | WO 2005/076358 | 8/2005 |
| WO | WO 2005/098745 | 10/2005 |
| WO | WO 2006/001287 | 1/2006 |
| WO | WO 2006/011664 | 2/2006 |
| WO | WO 2006/022169 | 3/2006 |

OTHER PUBLICATIONS

Search Report (Patent Cooperation Treaty Application No. PCT/JP2005/001541) dated Mar. 22, 2005.

Search Opinion (Patent Cooperation Treaty Application No. PCT/JP2005/001541) dated Mar. 22, 2005.

Nikkei Electronics, *"Sense of Crisis" is a trigger. Ignited evolution of a sesame-grain sized chip*, Leading Trends, Nov. 18, 2002, pp. 67-76.

* cited by examiner 301  304  305  303

301  302

FIG. 21A
FIG. 21B
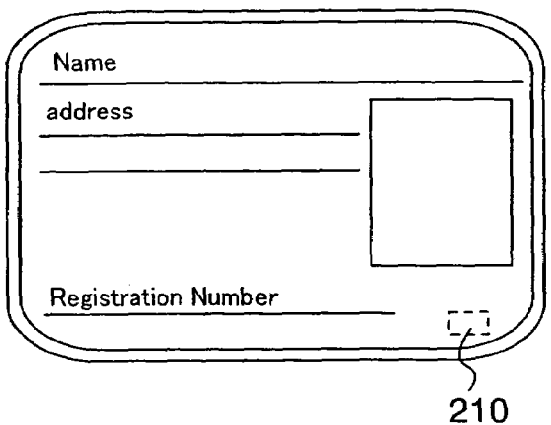
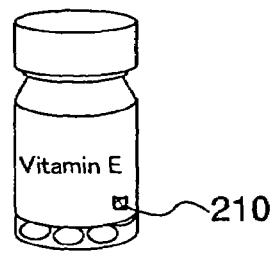
FIG. 21C
FIG. 21D
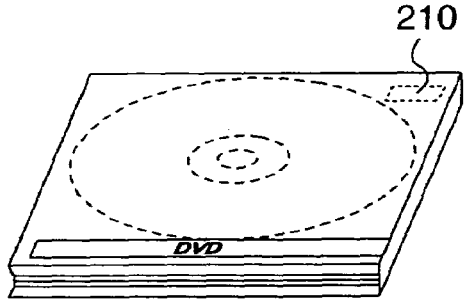
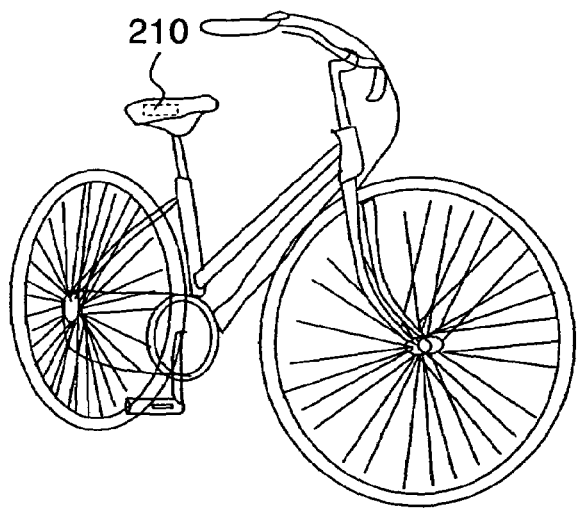
FIG. 21E
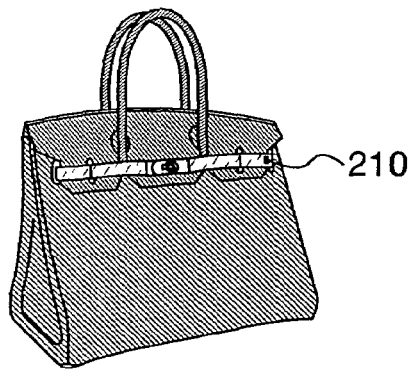

SEMICONDUCTOR DEVICE AND METHOD FOR MANUFACTURING THE SAME, AND ELECTRIC APPLIANCE

BACKGROUND OF THE INVENTION

1. Field of the Invention

The present invention relates to a semiconductor device and a method for manufacturing the semiconductor device, and an electric appliance.

2. Related Art

In recent years, technique of transferring a thin film integrated circuit provided over an insulating substrate has been developed. As the technique, for example, the technique that a release layer is provided between the thin film integrated circuit and a substrate, the thin film integrated circuit is separated from a support substrate by removing the release layer with gas containing halogen, and the thin film integrated circuit is transferred (see patent document 1) can be nominated.

Patent document 1: Unexamined patent publication No. H8-254686

However, the patent document 1 discloses that the release layer is formed over either surface of the substrate, a plurality of elements is formed over the release layer, and the release layer is removed, accordingly, the plurality of elements are separated from the substrate, and the substrate and the plurality of elements have space therebetween. Although the plurality of elements is bonded to the substrate, the plurality of elements may be flied from the substrate before bonding to the substrate since the plurality of elements has thin thicknesses of approximately several micro millimeters and is extremely lightweight.

SUMMARY OF THE INVENTION

In view of the foregoing, it is an object of the present invention to manufacture a semiconductor device while preventing a plurality of the elements from flying. It is another object of the present invention to provide a semiconductor device having a plurality of functions and a method for manufacturing the semiconductor device.

One embodiment of the present invention is a semiconductor device comprising a thin film integrated circuit; a first substrate having a sensor or an antenna; and a second substrate having an antenna; wherein the thin film integrated circuit is interposed between the first substrate having a sensor or an antenna and the second substrate having an antenna.

In the foregoing semiconductor device, the thin film integrated circuit and the sensor are electrically connected to each other with conductive particles, and the thin film integrated circuit and the antenna are electrically connected to each other with conductive particles. Further, the thin film integrated circuit and the sensor are in contact with resin including conductive particles and the thin film integrated circuit and the antenna are in contact with resin including conductive particles. Moreover, the first substrate and the second substrate have flexibility.

One embodiment of the present invention is as follows. After forming a release layer over a first substrate, the release layer is selectively removed to form a first region provided with the release layer and a second region not provided with the release layer. Then, a base insulating layer is formed over the first region and the second region. Accordingly, the base insulating layer is in contact with the release layer in the first region, whereas the insulating layer is in contact with the first substrate in the second region. And then, a thin film integrated circuit including a plurality of thin film transistors is formed over the base insulating layer. An opening portion is provided to the base insulating layer and an insulating layer provided over the thin film integrated circuit to remove the release layer by introducing an etching agent into the opening portion. In that case, the substrate and the base insulating layer have space therebetween in the first region provided with the release layer; however, the substrate and the base insulating layer in the second region remain to adhere to each other. Since there is a region where the first substrate and the base insulating layer adhere to each other even after removing the release layer, the thin film integrated circuit provided over the base insulating layer can be prevented from flying. After removing the release layer, the thin film integrated circuit and the second substrate having an antenna are combined integrally so that a conductive layer over the second substrate is in contact with a first conductive layer for connection of the thin film integrated circuit after removing the release layer. Then, the thin film integrated circuit and a base are separated from the first substrate. In that case, a second conductive layer for connection is exposed at a reverse surface. The thin film integrated circuit and a third substrate having an antenna or a sensor are attached to each other so that a conductive layer over the third substrate is connected to the second conductive layer for connection of the thin film integrated circuit.

One embodiment of the present invention is a method for a manufacturing the semiconductor device which comprises the steps of forming selectively a release layer over a first substrate; forming a base insulating layer so as to be in contact with the first substrate and the release layer; forming a plurality of thin film transistors over the base insulating layer; forming a first opening portion so that the first substrate is exposed; forming a second opening portion so that source and drain regions of the plurality of thin film transistors are exposed; forming a first conductive layer for filling the first opening portion and a second conductive layer for filling the second opening portion; forming a third opening portion so that the release layer is exposed; removing the release layer by introducing an etching agent into the third opening portion; separating the plurality of thin film transistors from the first substrate after attaching the plurality of thin film transistors onto a second substrate so that the second conductive layer is connected to a third conductive layer provided over the second substrate; and attaching the plurality of thin film transistors onto a third substrate so that the first conductive layer is connected to a fourth conductive layer provided over the third substrate.

One embodiment of the present invention is a method for a manufacturing the semiconductor device which comprises the steps of forming selectively a release layer over a first substrate; forming a base insulating layer so as to be in contact with the first substrate and the release layer; forming a plurality of thin film transistors over the base insulating layer; forming a first opening portion so that the first substrate is exposed; forming a second opening portion so that source and drain regions of the plurality of thin film transistors are exposed; forming a first conductive layer for filling the first opening portion and a second conductive layer for filling the second opening portion; forming a third opening portion so that the release layer is exposed; removing selectively the release layer by introducing an etching agent into the third opening portion; peeling the plurality of thin film transistors from the first substrate by a physical means (physical force) after attaching the plurality of thin film transistors onto a second substrate so that the second conductive layer is connected to a third conductive layer provided over the second substrate; and attaching the plurality of thin film transistors onto a third substrate so that the first conductive layer is connected to a fourth conductive layer provided over the third substrate.

In the foregoing manufacturing method, the first substrate is a glass substrate, a quartz substrate, a metal substrate having an insulating layer, a plastic substrate which can withstand the processing temperature in a manufacturing process, or the like. As the release layer, a layer made from an element selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), plumbum (Pb), osmium (Os), iridium (Ir), and silicon (Si); an alloy material mainly containing the foregoing elements; or a compound material mainly containing the foregoing elements is formed. Alternatively, a layer containing an oxide of the foregoing element is formed under oxygen atmosphere by a sputtering method as the release layer. Further alternatively, as the release layer, a layer is formed by using the foregoing element, an alloy material mainly containing the foregoing elements, or a compound material mainly containing the foregoing element and a layer containing an oxide of silicon is formed thereover. The etching agent is gas or liquid containing halogen fluoride.

One embodiment of the present invention is a semiconductor device comprising: a first conductive layer provided over a first substrate; a base insulating layer covering the first conductive layer; a first thin film transistor and a second thin film transistor which are provided over the base insulating layer; an interlayer insulating layer covering the first thin film transistor and the second thin film transistor; a second conductive layer and a third conductive layer which are provided over the interlayer insulating layer; and a fourth conductive layer provided over a second substrate; wherein the second conductive layer is connected to source and drain regions of the first thin film transistor via an opening portion provided in the interlayer insulating layer and to the first conductive layer via an opening portion provided in each of the base insulating layer and the interlayer insulating layer, and the third conductive layer is connected to source and drain regions of the second thin film transistor via an opening portion provided in the interlayer insulating layer and to the fourth conductive layer.

Further, the first substrate and the second substrate have flexibility.

The first conductive layer and the second conductive layer are electrically connected to each other with conductive particles, and the third conductive layer and the fourth conductive layer are electrically connected to each other with conductive particles. Each of the first substrate, the base insulating layer, the interlayer insulating layer and the second substrate is in contact with resin including conductive particles.

The first conductive layer and the fourth conductive layer can serve as antennas. Further, the first conductive layer can serve as an antenna, whereas the fourth conductive layer can be electrically connected to the sensor.

The second conductive layer has a region which is in contact with the first conductive layer via a resin including conductive particles and a region which is in contact with the interlayer insulating layer.

Each of the first thin film transistor and the second thin film transistor may have a side wall insulating layer.

According to the present invention, a semiconductor device having a thin film integrated circuit can be readily manufactured and the thin film integrated circuits provided above a base insulating layer can be prevented from dispersing by removing a release layer while forming a region where a substrate and the base insulating layer adhere to each other.

The semiconductor device according to the present invention has a thin film integrated circuit unit and a plurality of antennas. Therefore, even in the case of one antenna is broken, an electromagnetic wave supplied from an external device can be received by another antenna, and so durability can be improved. In the case that frequency bands available for communication by a plurality of antennas are different from each other, a plurality of frequency bands can be received, and so the range of choice of the reader/writer is expanded.

The semiconductor device according to the present invention has a thin film integrated circuit unit, an antenna, and a sensor. After processing information detected by the sensor by the thin film integrated circuit unit, the information can be stored. Further, the detected information by the sensor can be converted to signals and the signals can be output to a reader/writer via the antenna. Therefore, a semiconductor device is added with higher value than that of the conventional semiconductor device such as a wireless chip.

These and other objects, features and advantages of the present invention will become more apparent upon reading of the following detailed description along with the accompanied drawings.

BRIEF DESCRIPTION OF THE DRAWINGS

FIGS. 21A to 21E are explanatory views for showing usage patterns of a semiconductor device according to the present invention;

DESCRIPTION OF THE INVENTION

The above and further objects and novel features of the invention will more fully appear from the following details description when the same is read in connection with the accompanying drawings. As the present invention may be embodied in several forms, it is to be understood that various changes and modifications will be apparent to those skilled in the art without departing from the spirit of essential characteristics of the present invention. Therefore, unless otherwise such changes and modifications depart from the scope of the present invention hereinafter described, they should be construed as being included therein. Through the drawings of the embodiment modes, like components are denoted by like numerals as of the first embodiment mode and will not be further explained.

EMBODIMENT MODE 1

A method for manufacturing a semiconductor device according to the present invention is explained with reference to the drawings.

Figure 1A:
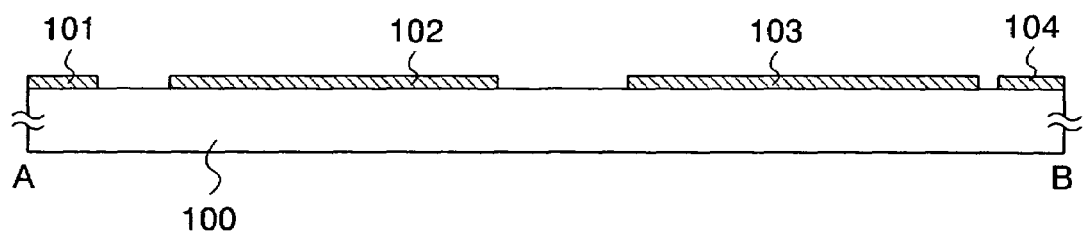
FIGS. 1A to 1E are explanatory views for showing a method for manufacturing a semiconductor device according to the present invention.
Figure 1B:
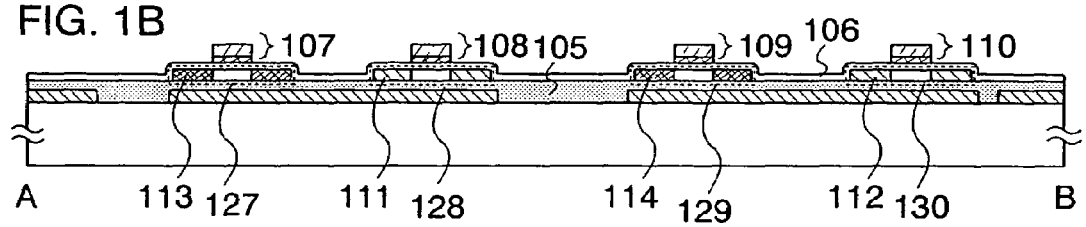
Figure 5A:
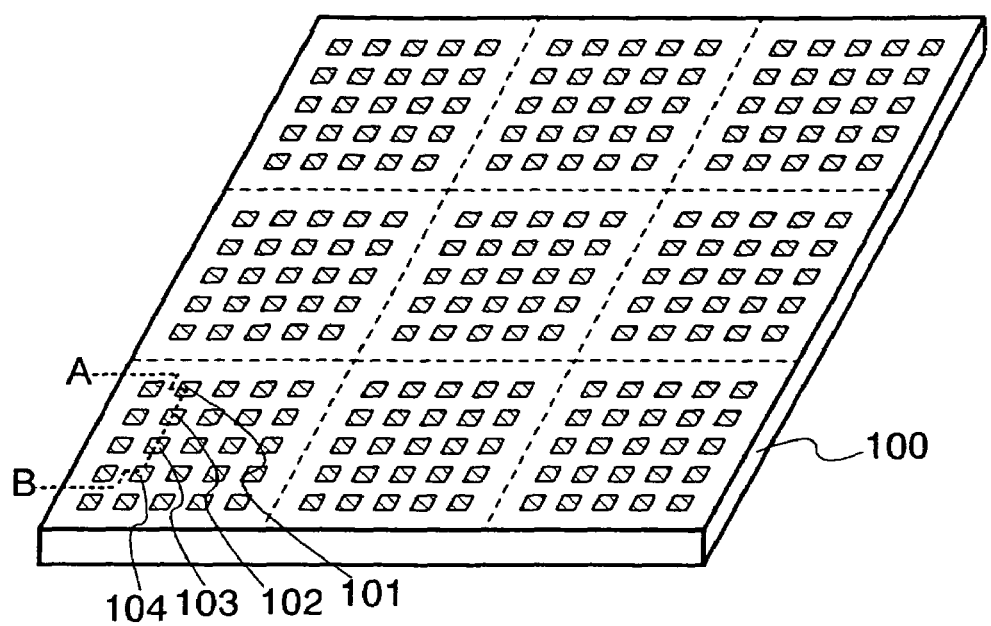
FIGS. 5A and 5B are explanatory views for showing a method for manufacturing a semiconductor device according to the present invention.

Release layers 101 to 104 are formed over one surface of a substrate 100 (refer to a cross-sectional view in FIG. 1A and a perspective view in FIG. 5A in which line A-B in FIG. 1A corresponds to line A-B in FIG. 5A).

As shown in FIG. 1A, a glass substrate, a quartz substrate, a metal substrate provided with an insulating layer over its either surface, a stainless substrate provided with an insulating layer over its either surface, or a plastic substrate having heat resistance which can withstand processing temperature of this process can be used as the substrate 100. The foregoing substrate 100 has no limitation in a size or a shape. For example, productivity can be drastically improved in the case of using a substrate having a side of one meter or more and having a rectangular shape as the substrate 100. This advantage is higher than that in the case of using a circular silicon substrate.

A thin film integrated circuit over the substrate 100 is separated from the substrate 100 afterwards. Therefore, the substrate 100 may be reused, and a thin film integrated circuit can be newly provided over the substrate 100. As a result, costs can be reduced. Further, a quartz substrate is preferably used as the substrate 100 to be reused.

After forming a thin film over one surface of the substrate 100, the release layers 101 to 104 are selectively pattern formed by a photolithography method. As the release layers 101 to 104, a single layer or a lamination layer made from an element selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), plumbum (Pb), osmium (Os), iridium (Ir), and silicon (Si); an alloy material mainly containing the foregoing elements; or a compound material mainly containing the foregoing elements is formed. A crystalline structure of a layer containing silicon may be any one of an amorphous structure, a microcrystalline structure, or a polycrystalline structure.

In the case that each of the release layers 101 to 104 is formed by a single layer, a tungsten layer, a molybdenum layer, or a layer containing a mixture of tungsten and molybdenum is formed. Alternatively, a layer containing an oxide or an oxynitride of tungsten, a layer containing an oxide or an oxynitride of molybdenum, or a layer containing an oxide or an oxynitride of a mixture of tungsten and molybdenum is formed. The mixture of tungsten and molybdenum corresponds to an alloy of tungsten and molybdenum.

In the case that each of the release layers 101 to 104 is formed by a lamination layer, a tungsten layer, a molybdenum layer, or a layer containing a mixture of tungsten and molybdenum is preferably formed as a first layer; and an oxide, a nitride, an oxynitride, or a nitride oxide of tungsten, molybdenum, or a mixture of tungsten and molybdenum is preferably formed as a second layer.

In the case of forming a lamination layer of a layer containing tungsten and a layer containing an oxide of tungsten as each of the release layers 101 to 104, the layer containing tungsten is firstly formed and a layer containing a silicon oxide is formed thereover; accordingly, a layer containing an oxide of tungsten is formed at an interface between the tungsten layer and the silicon oxide layer. The layer containing an oxide of tungsten can be utilized. Moreover, a layer containing an oxide of tungsten may be formed by performing thermal oxidization treatment, oxygen plasma treatment, or treatment with solution having strong oxidizability such as ozone water for the surface of the layer containing tungsten. The same is true in the case of forming a layer containing tungsten and forming a layer containing a nitride, an oxynitride, and a nitride oxide of tungsten over the layer containing tungsten. After forming the layer containing tungsten, a silicon nitride layer, a silicon oxynitride layer, and a silicon nitride oxide layer may be preferably formed.

An oxide of tungsten is denoted by WOx. The "x" in the WOx is in the range of 2 to 3. For example, there are $WO_2$ (x is 2), $W_2O_5$ (x is 2.5), $W_4O_{11}$ (x is 2.75), $WO_3$ (X is 3), and the like. The value of the foregoing "x" is not restricted when forming an oxide of tungsten. The value can be determined based on the etching rate or the like. A layer having the most preferable etching rate is a layer containing an oxide of tungsten (WOx, 0<x<3) formed by a sputtering method under oxygen atmosphere. Therefore, the layer containing an oxide of tungsten is preferably formed by a sputtering method under oxygen atmosphere as the release layer in order to reduce hours of manufacturing.

In the foregoing process, the release layers 101 to 104 are formed so as to be in contact with the substrate 100; however, the present invention is not limited thereto. A base insulating layer may be formed so as to be in contact with the substrate 100, and the release layers 101 to 104 may be formed so as to be in contact with the insulating layer.

Then, a base insulating layer 105 is formed so as to cover the release layers 101 to 104. The insulating layer 105 is formed by a single layer or a lamination layer of a layer containing an oxide of silicon or a nitride of silicon by a known method (sputtering method, plasma CVD method, or the like). A material of the oxide of silicon is a material containing silicon (Si) and oxygen (O) such as silicon oxide, silicon oxynitride, or silicon nitride oxide. A material of the nitride of silicon is a material containing silicon and nitrogen (N) such as silicon nitride, silicon oxynitride, or silicon nitride oxide.

In the case that the base insulating layer 105 has a two-layer structure, for example, a silicon nitride oxide layer can be formed as the first layer and a silicon oxynitride layer can be formed as the second layer. In the case that the base insulating layer has a three-layer structure, a silicon oxide layer can be formed as the first insulating layer, a silicon nitride oxide layer can be formed as the second insulating layer, and a silicon oxynitride layer can be formed as the third insulating layer. Alternatively a silicon oxynitride layer can be formed as the first insulating layer, a silicon nitride oxide layer can be formed as the second insulating layer, and a silicon oxynitride layer can be formed as the third insulating layer. The base insulating layer serves as a blocking film for preventing impurities from the substrate 100 from penetrating into a crystalline semiconductor layer to be formed afterwards.

Then, an amorphous semiconductor layer (for example, a layer containing amorphous silicon) is formed over the insulating layer 105. The amorphous semiconductor layer is formed to have a thickness of from 25 to 200 nm (preferably, 30 to 150 nm) by a known method (sputtering method, LPCVD method, plasma CVD method, or the like). And then, the amorphous semiconductor layer is crystallized by a known crystallization method (laser crystallization method, RTA, thermal crystallization method using a furnace annealing oven, thermal crystallization method using a metal element which promotes crystallization, a method which combines the thermal crystallization method using a metal element promoting crystallization and the laser crystallization method, or the like). Thereafter, an obtained crystalline semiconductor layer is patterned into desired shapes to form crystalline semiconductor layers 127 to 130.

The following is a specific example of a manufacturing process for the crystalline semiconductor layers 127 to 130. Firstly, an amorphous semiconductor layer having a thickness of 66 nm is formed by a plasma CVD method. Then, solution including nickel which is a metal element promoting crystallization is provided over the amorphous semiconductor layer, and then, dehydrogenation treatment (500° C., 1 hour) and thermal crystallization treatment (550° C., 4 hours) for the amorphous semiconductor layer are performed to form a crystalline semiconductor layer. Thereafter, laser light is emitted to the crystalline semiconductor layer as needed, the crystalline semiconductor layers 127 to 130 are formed by patterning using a photolithography method.

In the case that the crystalline semiconductor layers 127 to 130 are formed by a laser crystallization method, continuous or pulse oscillation of gas or solid laser is used. As the gas laser, excimer laser, YAG laser, $YVO_4$ layer, YLF laser, $YAlO_3$ laser, glass laser, ruby laser, Ti: sapphire laser, or the like is used. As the solid laser, laser using a crystal such as YAG, $YVO_4$, YLF, or $YAlO_3$ doped with Cr, Nd, Er, Ho, Ce, Co, Ti, or Tm is used.

When an amorphous semiconductor layer is crystallized using a metal element which promotes crystallization, there are advantages that crystallization can be completed in a short time at low temperature and crystal orientation can be aligned, on the other hand, there is a disadvantage that off current is increased since the metal element remains in a crystal semiconductor layer, which leads to instability of characteristics. In view of this, an amorphous semiconductor layer serving as a gettering site can be formed over a crystal semiconductor layer. Since the amorphous semiconductor layer serving as a gettering site is required to contain an impurity element such as phosphorus or argon, the amorphous semiconductor layer is preferably formed by a sputtering method which can make the amorphous semiconductor layer contain the argon in high density. Thereafter, the metal element is dispersed by heat treatment (RTA, thermal annealing using a furnace annealing oven, or the like), and the amorphous semiconductor layer containing the metal element is removed. Accordingly, the metal element in the crystalline semiconductor layer can be reduced or removed.

A gate insulating layer 106 which covers the crystalline semiconductor layers 127 to 130 is formed. The gate insulating layer 106 is formed by a single layer or a lamination layer which contains an oxide of silicon or a nitride of silicon by a known method (plasma CVD or sputtering method). Specifically, the gate insulating layer 106 is formed by a single or a lamination layer of a layer containing silicon oxide, a layer containing silicon oxynitride, or a layer containing silicon nitride oxide.

A first conductive layer and a second conductive layer are stacked over the gate insulating layer 106. The first conductive layer is formed by a known method (plasma CVD or sputtering method) to have a thickness of 20 to 100 nm. The second conductive layer is formed by a known method to have a thickness of 100 to 400 nm. The first conductive layer and the second conductive layer are made from an element selected from the group consisting of tantalum (Ta), tungsten (W), titanium (Ti), molybdenum (Mo), aluminum (Al), copper (Cu), chromium (Cr), and niobium (Nb); an alloy material containing mainly the foregoing elements; or a compound material containing mainly the foregoing elements. Alternatively, the first conductive layer and the second conductive layer are made from semiconductor materials as typified by polycrystalline silicon doped with an impurity element such as phosphorus.

As an example of combination of the first conductive layer and the second conductive layer, a tantalum nitride (TaN) layer/a tungsten (W) layer, a tungsten nitride (WN) layer/a tungsten (W) layer, a molybdenum nitride (MoN) layer/a molybdenum (Mo) layer, or the like can be nominated. Since tungsten and tantalum nitride have high heat resistance, heat treatment aiming at thermal activation can be carried out after forming the first conductive layer and the second conductive layer. In the case of not a two-layer structure but a three-layer structure, the structure composed of a molybdenum layer, an aluminum layer, and a molybdenum layer is preferably adopted.

Further, a single layered conductive layer may be formed by using a material which is the same as that for the first or second conductive layer instead of forming a lamination layer of the first conductive layer and the second conductive layer.

A mask formed by a resist by a photolithography method and etching treatment is carried out to form a gate electrode. Then, conductive layers serving as gate electrodes (also referred to as a gate electrode layer) 107 to 110 are formed.

An n-type impurity element is doped in low density to the crystalline semiconductor layers 128, 130 by an ion doping method or an ion injecting method to form n-type impurity regions 111, 112. As the n-type impurity element, the 15 group element, for example, phosphorus (P) or arsenic (As) is used.

Then, a p-type impurity element is doped to the crystalline semiconductor layers 127, 129 to form p-type impurity regions 113, 114. As the p-type impurity element, for example, boron (B) is used.

An insulating layer is formed so as to cover the gate insulating layer 106 and the conductive layers 107 to 110. The insulating layer is formed to have a single layer or a lamination layer of a layer containing an inorganic material such as silicon, an oxide of silicon, or a nitride of silicon (which may be referred to as an inorganic layer); or a layer containing an organic material such as organic resin (which may be referred to as an organic layer) by a known method (plasma CVD or sputtering method). The insulating layer is preferably formed by a layer made from an oxide of silicon.

Figure 1C:
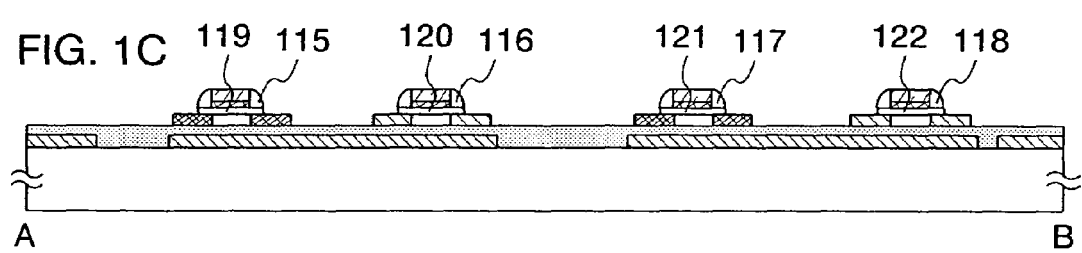
Figure 1D:
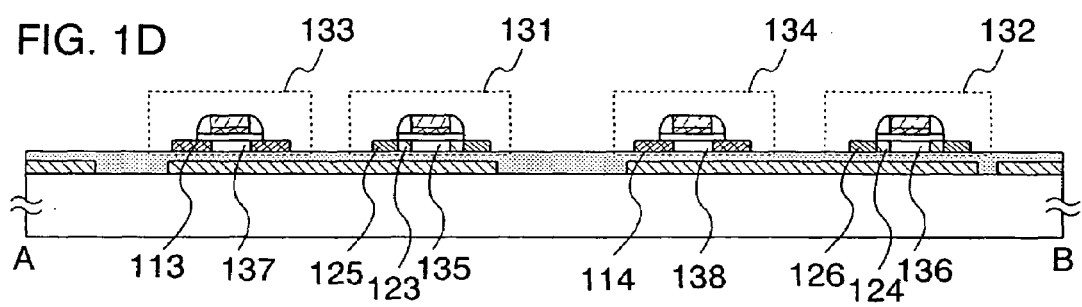

The insulating layer is selectively etched by anisotropic etching mainly in the vertical direction to form insulating layers 115 to 118 which are in contact with the sides of conductive layers 107 to 110 (hereinafter, referred to as side wall insulating layers) (refer to FIG. 1C). The side wall insulating layers 115 to 118 are used as masks for doping to form afterwards an LDD region.

By the etching process for forming the side wall insulating layers 115 to 118, the gate insulating layer 106 is also etched to form gate insulating layers 119 to 122. The conductive layers 107 to 110 and the side wall insulating layers 115 to 118 are overlapped with the gate insulating layers 119 to 122. The fact that the gate insulating layer 106 and the side wall insulating layers 115 to 118 have the same etching rates with each other is the reason why the gate insulating layer 106 is also etched. FIG. 1C illustrates that case. Therefore, the gate insulating layer 106 may remain even though an etching process to form the side wall insulating layers 115 to 118 is carried out in the case that the gate insulating layer 106 and the side wall insulating layers 115 to 118 have different etching rates from each other.

An n-type impurity element is doped to the crystalline semiconductor layers 128, 130 by using the side wall insulating layers 115 to 118 as masks to form first n-type impurity regions (also referred to as LDD regions) 123, 124 and second n-type impurity regions 125, 126. The density of the impurity element doped in the first n-type impurity regions 123, 124 is lower than that of the impurity element in the second n-type impurity regions 125, 126.

In order to form the first n-type impurity regions 123, 124, there are a method of forming the gate electrode to have a two or more layered structure and etching the gate electrode by taper etching or anisotropic etching using a bottom conductive layer which constructs the gate electrode as a mask, and a method of using the side wall insulating layer as a mask. A thin film transistor formed by the former method is referred to as a GOLD (Gate Overlapped Lightly Doped drain) structure. In the present invention, either method can be used. In the case of the latter method of using the side wall insulating layer as a mask, there is an advantage that the LDD region can be certainly formed and the width of the LDD region can be readily controlled.

Through the foregoing process, n-type thin film transistors 131, 132 and p-type thin film transistors 133, 134 are completed.

The n-type thin film transistor 131 has an LDD structure including an active layer having the first n-type impurity region 123 (which is also referred to as an LDD region), the second n-type impurity region 125, and the channel formation region 135, the gate insulating layer 120, and the conductive layer serving as a gate electrode 108.

The n-type thin film transistor 132 has an LDD structure including an active layer having the first n-type impurity region 124 (which is also referred to as an LDD region), the second n-type impurity region 126, and the channel formation region 136, the gate insulating layer 122, and the conductive layer serving as a gate electrode 110.

The p-type thin film transistor 133 has a single drain structure including an active layer having the p-type impurity region 113 and the channel formation region 137, the gate insulating layer 119, and the conductive layer 107 serving as a gate electrode.

The p-type thin film transistor 134 has a single drain structure including an active layer having the p-type impurity region 114 and the channel formation region 138, the gate insulating layer 121, and the conductive layer 109 serving as a gate electrode.

Figure 1E:
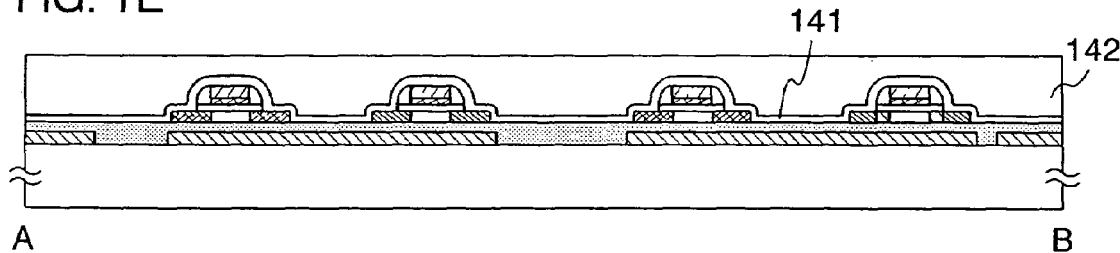

Then, an insulating layer is formed to have a single layer or a lamination layer so as to cover the thin film transistors 131 to 134 (refer to FIG. 1E). The insulating layer covering the thin film transistors 131 to 134 is formed by a single layer or a lamination layer made from an inorganic material such as an oxide of silicon or a nitride of silicon, an organic material such as polyimide, polyamide, benzocyclobutene, acrylic, epoxy, or siloxane, or the like by a known method (a coating method, a droplet discharging method, a CVD method, a sputtering method, or the like). Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

The illustrated cross-sectional view shows that two insulating layers are staked so as to cover the thin film transistors 131 to 134. A layer containing silicon oxide is formed as an insulating layer 141 which is stacked firstly. Siloxane is used for forming an insulating layer 142 which is stacked secondly. Moreover, a layer containing silicon nitride can be formed between the first insulating layer and the second insulating layer.

Before forming the insulating layers 141, 142 or after forming one or both of the insulating layers 141, 142, heat treatment aiming at recovery of crystallinity of a semiconductor layer, activation of an impurity element doped to the semiconductor layer, or hydrogenation of the semiconductor layer is preferably carried out. As the heat treatment, thermal annealing, laser annealing, or RTA may be performed.

Figure 2A:
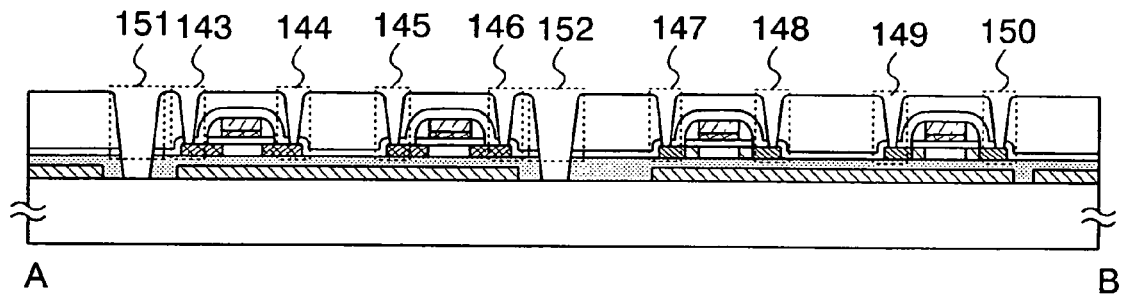
FIGS. 2A to 2D are explanatory views for showing a method for manufacturing a semiconductor device according to the present invention.

The insulating layers 141, 142 are etched by a photolithography method to form contact holes 143 to 150 for exposing the p-type impurity regions 113, 114 and the second n-type impurity regions 125, 126, and contact holes 151, 152 for exposing the substrate 100 (refer to FIG. 2A).

The contact holes 151, 152 are formed so as not to be in contact with the release layer. By forming the contact holes 151, 152 in the position, a conductive layer filling the contact holes can be prevented from being removed when removing the release layer. As a result, poor elements can be reduced and manufacturing yields of a semiconductor device can be improved.

Figure 2B:
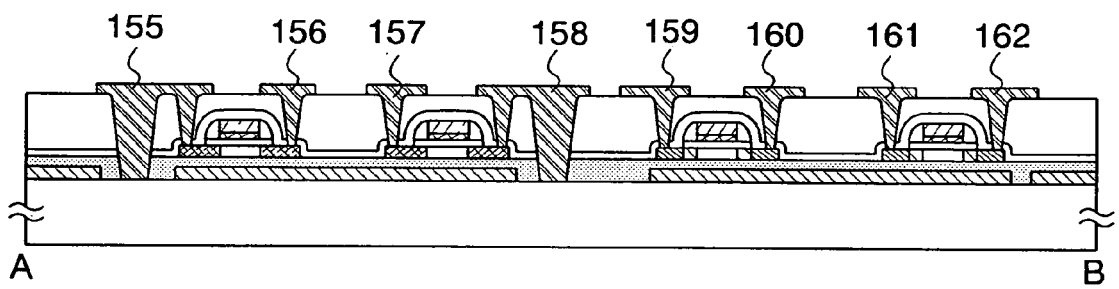

A conductive layer is formed so as to fill the contact holes 143 to 152 and patterned into conductive layers 155 to 162 (refer to FIG. 2B). The side faces of the conductive layers 155, 158 formed by this means are not in contact with the release layers 101 to 104 but insulating layers 141, 142. This prevents the conductive layers 155, 158 from being removed with an etching agent when removing the release layers 101 to 104 with the etching agent.

The conductive layers 155 to 162 are formed to have a single layer or a lamination layer made from an element selected from the group consisting of titanium (Ti), aluminum (Al), and neodymium (Nd), an alloy material mainly containing the foregoing elements, or a compound material mainly containing the foregoing elements. An alloy material mainly containing aluminum is, for example, an alloy material containing nickel and mainly aluminum or an alloy material containing nickel, either or both of carbon and silicon, and mainly aluminum.

The conductive layers 155 to 162 may be formed to have a laminated structure of, for example, barrier layer/aluminum-silicon (Al—Si) layer/barrier layer and barrier layer/aluminum-silicon (Al—Si) layer/titanium nitride layer/barrier layer. The barrier layer is a layer made from titanium, a nitride of titanium, molybdenum, or a nitride of molybdenum. Aluminum and aluminum-silicon are ideal for a material for the conductive layers 155 to 162 since those materials have a low value of resistance and are inexpensive. By forming barrier layers on top and bottom, hillock of the aluminum or aluminum-silicon can be prevented. The bottom barrier layer can make good contact between the aluminum or aluminum-silicon and the crystalline semiconductor layer. The titanium is a high reducing element. Accordingly, a thin natural oxide film may be formed over the crystalline semiconductor layer in the case of forming the barrier layer made from titanium; however, the natural oxide film can be reduced to make good contact between the titanium and the crystalline semiconductor layer.

Figure 2C:
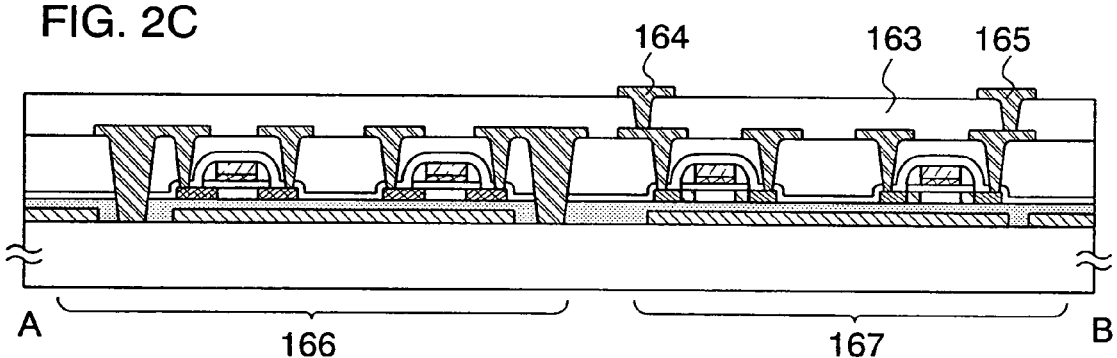

An insulating layer 163 is formed to have a single layer or a lamination layer so as to cover the conductive layers 155 to 162 (refer to FIG. 2C). The insulating layer 163 covering the conductive layers 155 to 162 can be formed by the same method and materials as those used for forming the insulating layer 142 covering the thin film transistor. Then, contact holes are provided to the insulating layer 163 covering the conductive layers 155 to 162. And then, conductive layers 164, 165 are formed. The conductive layers 164, 165 serve as conductive layers for connection to an external terminal.

An insulating layer may be formed so as to cover the conductive layers 164, 165. The insulating layer is a layer containing carbon such as DLC (diamond like carbon), a layer containing silicon nitride, a layer containing silicon nitride oxide, a layer containing an organic material (preferably, epoxy resin), or the like. The insulating layer serves as a protective layer and is formed only in case of necessity. By forming the insulating layer by a layer made from an organic material, a thickness of the insulating layer 163 can be increased. As a result, a plurality of elements over the substrate 100 is added with weight, and so the elements can be prevented from flying from the substrate 100, and being formed to be rolled, and being broken or deteriorated even after removing the release layers 101 to 104.

Figure 5B:
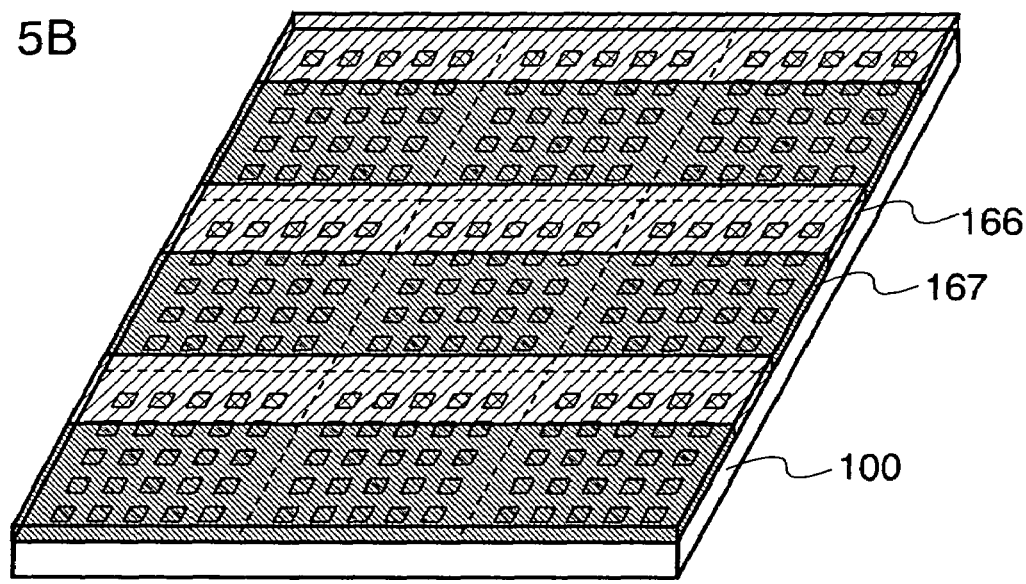

Here, the elements including the thin film transistors 131, 133, and the conductive layers 155 to 158, which are completed through the foregoing processes, are collectively referred to as a first thin film integrated circuit 166, whereas the elements including the thin film transistors 132, 134, and the conductive layers 159 to 162, 164, and 165 are collectively referred to as a second thin film integrated circuit 167 (refer to a cross-sectional view in FIG. 2C and a perspective view in FIG. 5B). In FIG. 2C, the first thin film integrated circuit 166 and the second thin film integrated circuit 167 are singly illustrated. Actually, the plurality of first thin film integrated circuits 166 and the second thin film integrated circuits 167 are arranged. Thus, a layer provided with the arranged plurality of first thin film integrated circuits 166 and the second thin film integrated circuits 167 may be referred to as a layer having the first thin film integrated circuits 166 and the second thin film integrated circuits 167.

The first thin film integrated circuit 166 is provided with at least a communication circuit for processing an electromagnetic wave received by a conductive layer 185 to be connected afterwards. The second thin film integrated circuit 167 is provided with at least a communication circuit for processing an electromagnetic wave received by a conductive layer 175 to be connected afterwards. The conductive layers 185 and 175 are illustrated as antennas for receiving an electromagnetic wave supplied from an external device.

In the case that the antenna constructed by the conductive layer 185 and the antenna constructed by the conductive layer 175 can receive the same frequency bands, the conductive layers may be connected to one thin film integrated circuit. In that case, the antenna constructed by the conductive layer 185 and the antenna constructed by the conductive layer 175 are preferably formed to be the same shape.

In the case that antenna constructed by the conductive layer 185 and the antenna constructed by the conductive layer 175 can receive different frequency bands, the conductive layers are connected to different thin film integrated circuits. In that case, the antenna constructed by the conductive layer 185 and the antenna constructed by the conductive layer 175 can be the different shapes. Therefore, the range of choice of the antenna can be increased.

Figure 2D:
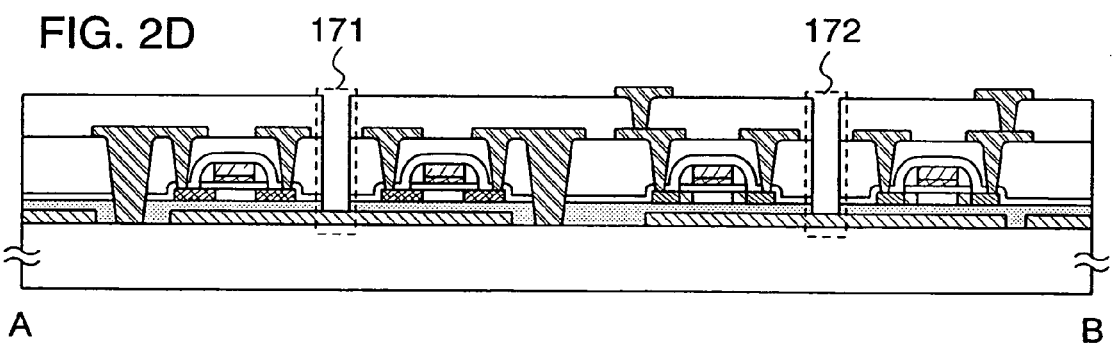
Figure 6A:
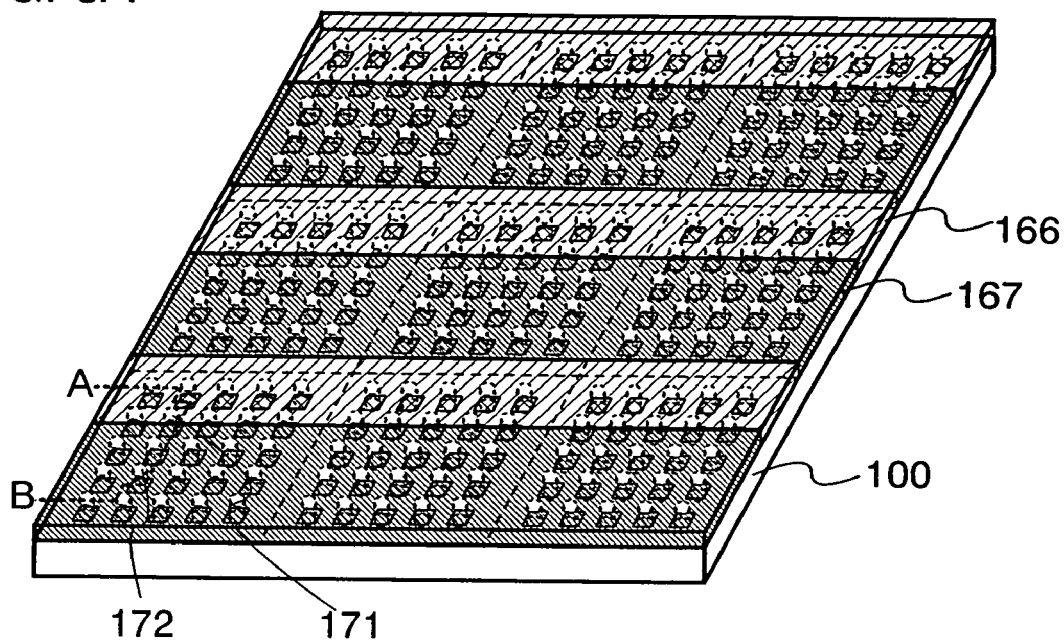
FIGS. 6A and 6B are explanatory views for showing a method for manufacturing a semiconductor device according to the present invention.

The insulating layers 105, 141, 142, and 163 are etched by a photolithography method to expose a part or all of the release layers 101 to 104 to form opening portions 171, 172 (refer to a cross-sectional view in FIG. 2D and a perspective view in FIG. 6A).

Figure 3A:
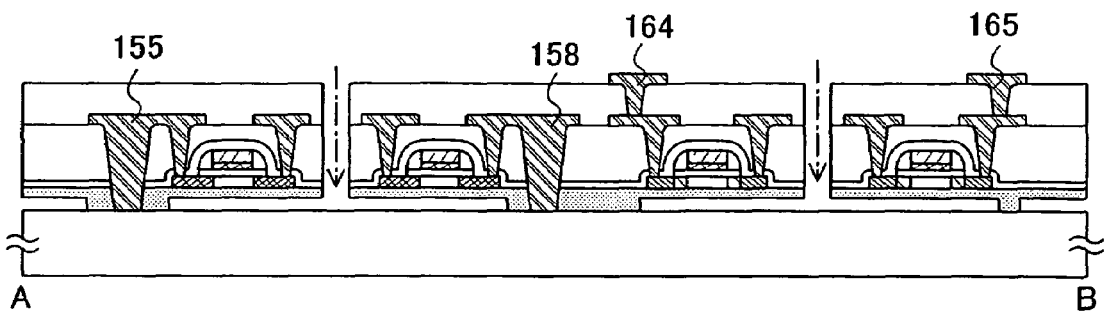
FIGS. 3A to 3D are explanatory views for showing a method for manufacturing a semiconductor device according to the present invention.
Figure 6B:
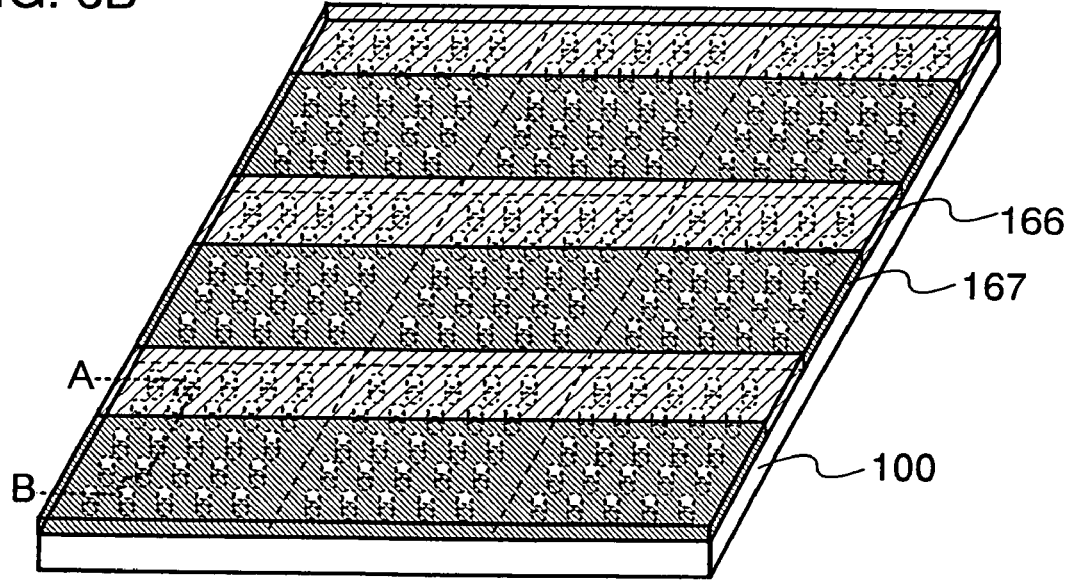

An etching agent is introduced into the opening portions 171, 172 to remove the release layers 101 to 104 (refer to a cross-sectional view in FIG. 3A and a perspective view in FIG. 6B). As the etching agent in the case of wet etching, mixture of fluorinated acid diluted with water or ammonium fluoride, mixture of fluorinated acid and nitric acid, mixture of fluorinated acid, nitric acid, and acetic acid, mixture of hydrogen peroxide and sulfuric acid, mixture of hydrogen peroxide, ammonium solution, and water, mixture of hydrogen peroxide, hydrochloric acid, and water, or the like. In the case of dry etching, gas containing halogen series atoms or molecules such as fluorine or gas containing oxygen is used. For example, gas or liquid containing halogen fluoride or an interhalogen compound is preferably used as the etching agent. For example, chlorine trifluoride ($ClF_3$) is used as gas containing halogen fluoride. Further, the conductive layers 155, 158 are provided so as not to be in contact with the release layers 101 to 104, and so the conductive layers 155, 158 are not etched with the etching agent.

Figure 3B:
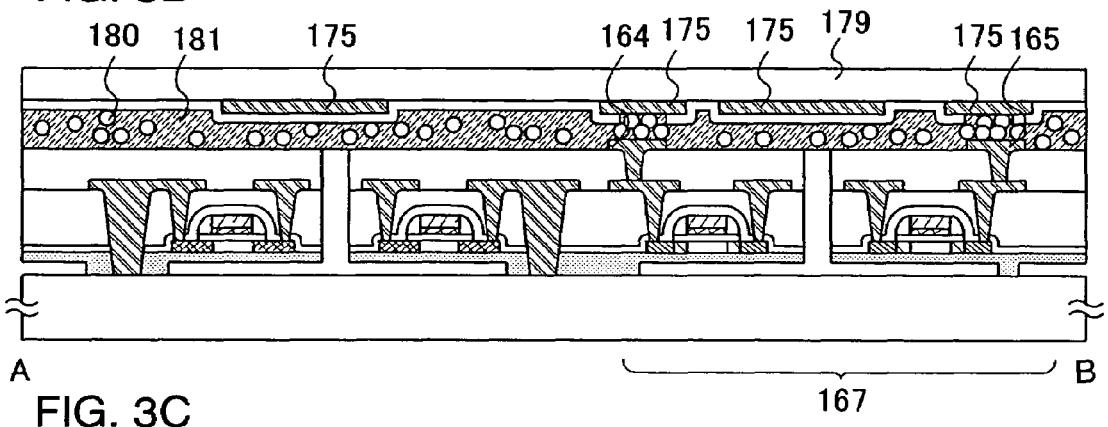
Figure 3C:
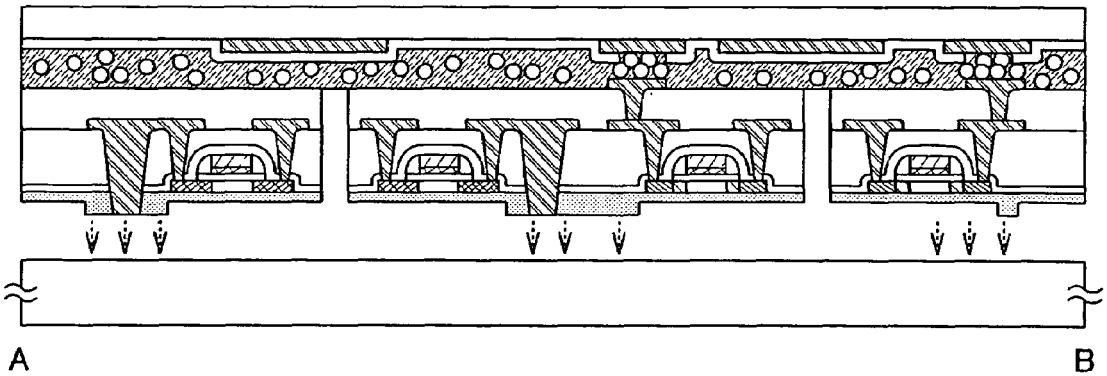
Figure 7A:
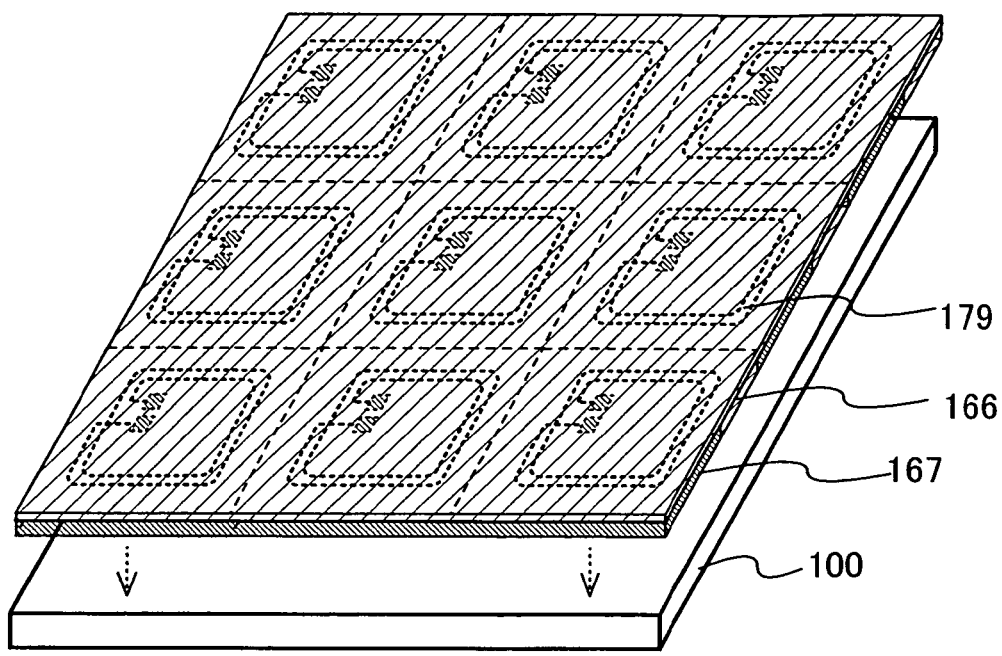
FIGS. 7A to 7C are explanatory views for showing a method for manufacturing a semiconductor device according to the present invention.

Either surface of the layer provided with the first thin film integrated circuit 166 and the second thin film integrated circuit 167 is bonded to a substrate 179 provided with a conductive layer 175 (refer to a cross-sectional view in FIG. 3B). The either surface of the layer provided with the first thin film integrated circuit 166 and the second thin film integrated circuit 167 is a surface where the conductive layers 164, 165 and opening portions 171, 172 are exposed. The layer provided with the first thin film integrated circuit 166 and the second thin film integrated circuit 167 is bonded to the substrate 179 with resin 181 including conductive particles 180, simultaneously, the conductive layers 164, 165 included in the second thin film integrated circuit 167 are made be in contact with the conductive layer 175 over the substrate 179 via the conductive particles 180. Thereafter, the first thin film integrated circuit 166 and the second thin film integrated circuit 167 are completely separated from the substrate 100 (refer to a cross-sectional view in FIG. 3C and a perspective view in FIG. 7A).

The substrate 179 provided with the conductive layer 175 corresponds to a film (made from polypropylene, polyester, vinyl, polyvinyl fluoride, vinyl chloride, or the like), a paper made from a fibrous material, a laminated film or the like of a base film (polyester, polyamide, an inorganic metallized film, papers, or the like) and an adhesive synthetic resin film (acrylic synthetic resin, epoxy synthetic resin, or the like), or the like. The film and a subject are sealed by thermocompression. When the sealing treatment is carried out, an adhesive layer provided to the topmost surface of the film or a layer (which is not the adhesive layer) provided to the outermost coat layer is melted by heat treatment to bond the film by application of pressure.

Figure 3D:
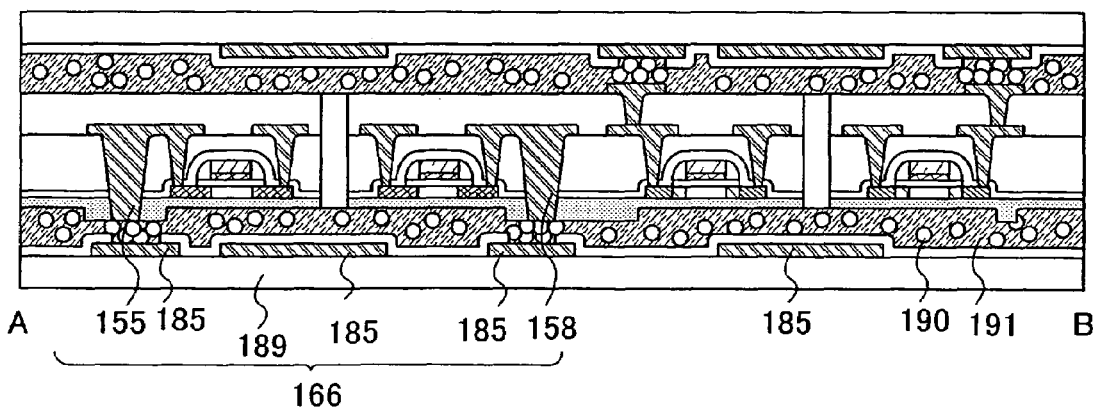
Figure 7B:
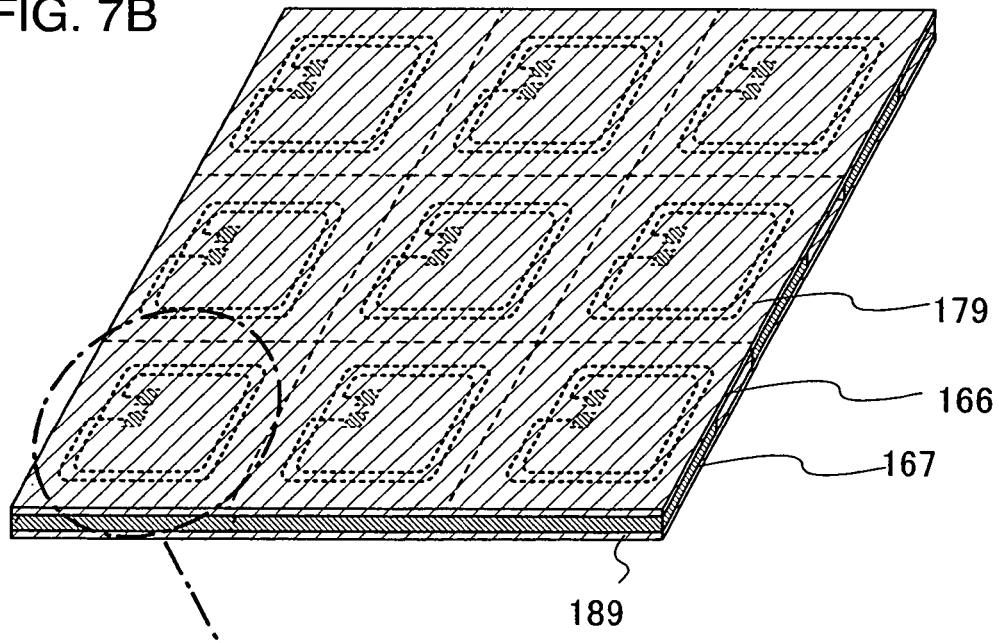

The other surface of the layer provided with the first thin film integrated circuit 166 and the second thin film integrated circuit 167 is bonded to a substrate 189 provided with a conductive layer 185 (refer to a cross-sectional view in FIG. 3D and a perspective view in FIG. 7B). The other surface of the layer provided with the first thin film integrated circuit 166 and the second thin film integrated circuit 167 is a surface where the conductive layers 155, 158 and the insulating layer 105 are exposed. The layer provided with the first thin film integrated circuit 166 and the second thin film integrated circuit 167 is bonded to the substrate 189 with resin 191 including conductive particles 190, simultaneously, the conductive layers 155, 158 included in the first thin film integrated circuit 166 are made be in contact with the conductive layer 185 over the substrate 189 via the conductive particles 190.

Figure 7C:
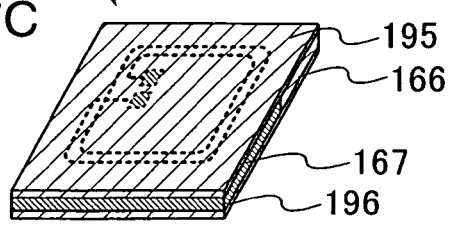

The integrated combination of the layer provided with the first thin film integrated circuit 166 and the second thin film integrated circuit 167, and the substrates 179, 189 having the conductive layers is divided into each piece of a wireless chip with slicing apparatus and laser irradiation apparatus (refer to a perspective view in FIG. 7C). Through the foregoing processes, a semiconductor device serving as a wireless chip (also referred to as a wireless processor, a wireless memory, or a wireless tag) composed of the divided substrates 195, 196, and the divided first and second thin film integrated circuits 166, 167 is completed.

In this embodiment mode, the semiconductor device serving as a wireless chip (also referred to as a wireless processor, a wireless memory, or a wireless tag) is formed by bonding the layer provided with the first thin film integrated circuit 166 and the second thin film integrated circuit 167 to the substrates 179, 189 having the conductive layers, and dividing into each piece. However, the present invention is not limited to the process. After bonding the layer provided with the first thin film integrated circuit 166 and the second thin film integrated circuit 167 to the substrate 179 having the conductive layer and dividing into each piece, a substrate having a conductive layer can be bonded to the divided layer provided with the first thin film integrated circuit 166 and the second thin film integrated circuit 167.

This embodiment mode describes the case that the conductive layers 175, 185 serving as antennas are provided over the divided substrates 195, 196. The conductive layers serving as antennas are made from a metal material containing aluminum, copper, or silver. For example, the conductive layers can be made from a composite in a paste form of copper or silver by a printing method such as a screen printing method, an offset printing method, or an ink jet method. Alternatively, an aluminum film can be formed by a sputtering method and processed by etching. Besides, an electroplating method or an electroless plating method can be used.

Figure 24:
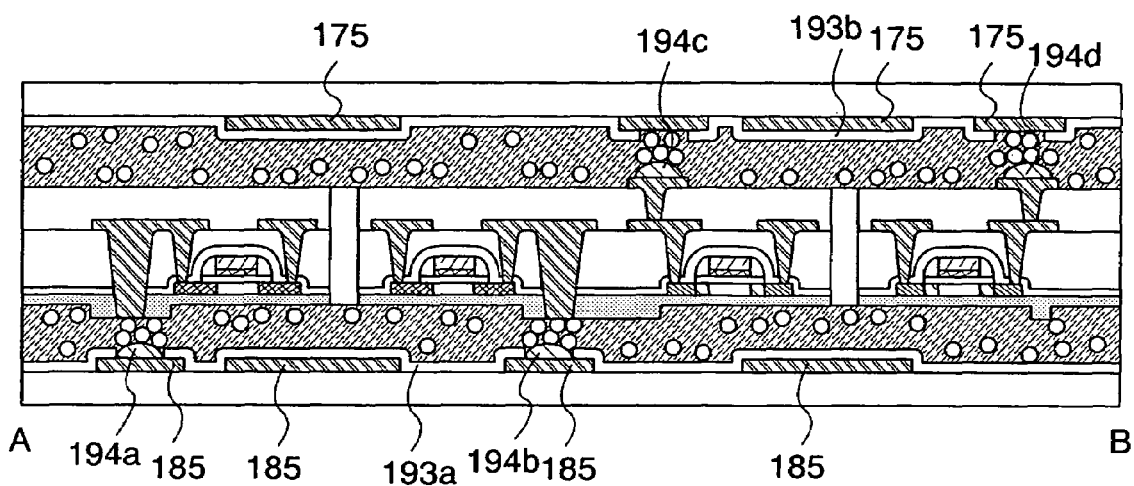
FIG. 24 is an explanatory view for showing a structure of a semiconductor device according to the present invention.

According to the foregoing embodiment mode, the layer provided with the first thin film integrated circuit 166 and the second thin film integrated circuit 167, and the substrates 179, 189 having the conductive layers are bonded to each other with the resin 181, 191 including conductive particles 180, 190. However, the present invention is not limited thereto. The layer provided with the first thin film integrated circuit 166 and the second thin film integrated circuit 167 and the substrates 179, 189 can be bonded to each other by using bumps 194*a* to 194*d* in addition to the resin 181, 191 (refer to FIG. 24).

The conductive layers 175, 185 over the substrates 179, 189 are covered by protective insulating layers 193*a*, 193*b*. The protective insulating layers 193*a*, 193*b* are provided with opening portion with which the bumps 194*a* to 194*d* and conductive particles are in contact.

Figure 14:
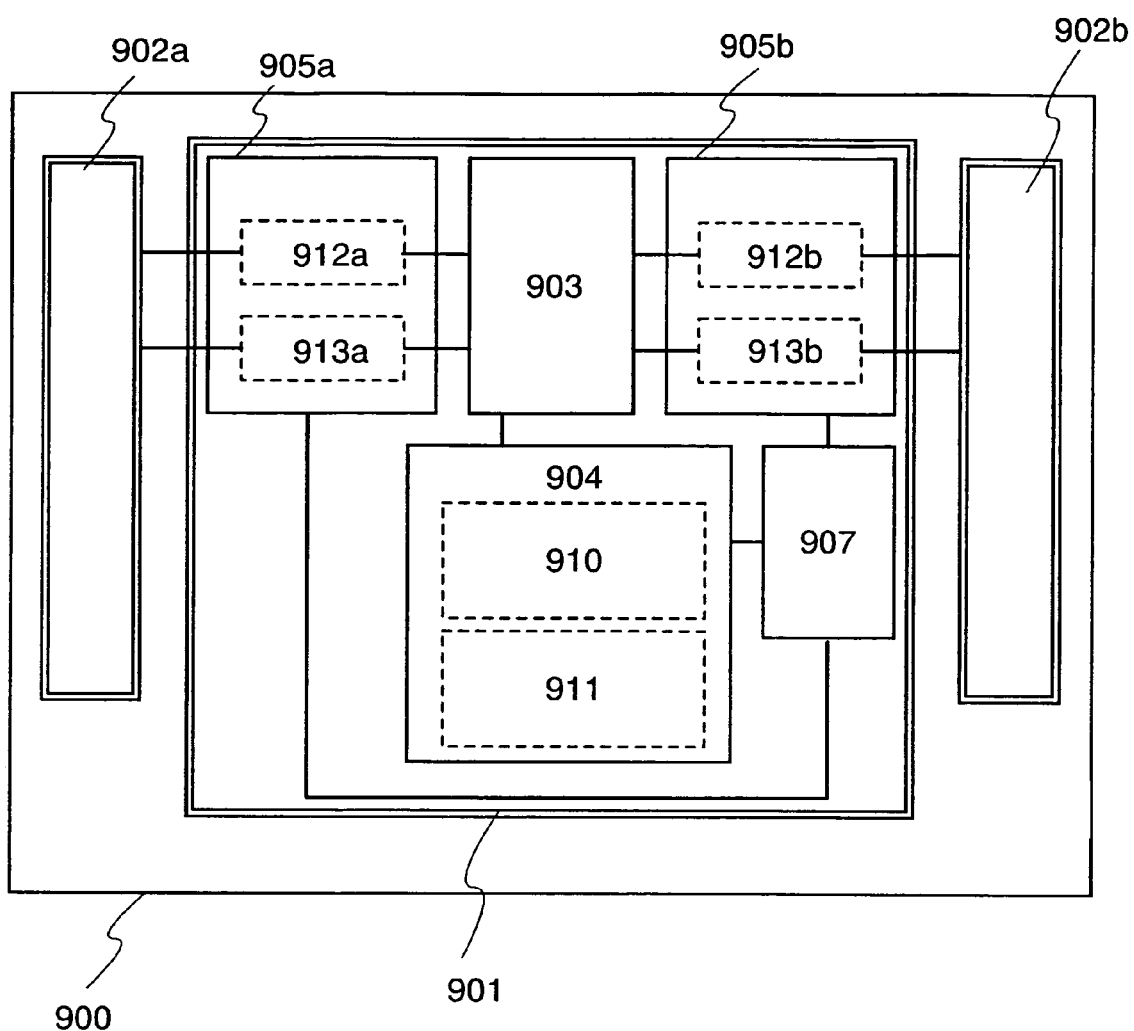
FIG. 14 is an explanatory view for showing a structure of a semiconductor device according to the present invention.

FIG. 14 is a view for showing the structure of the wireless chip 900 described in this embodiment mode. The wireless chip according to this embodiment mode has a thin film integrated circuit 901 and antennas 902*a*, 902*b*.

The thin film integrated circuit 901 is composed of the first thin film integrated circuit 166 and the second thin film integrated circuit 167 and has an arithmetic processing circuit unit 903, a memory unit 904, communication circuit units 905*a*, 905*b*, and a power source circuit unit 907. The memory unit 904 has either or both of a read-only memory and a rewritable memory. The memory unit 904 is composed of a static RAM, an EEPROM (Electrically Erasable Programmable Read-Only Memory), a flash memory, and the like, and so the memory unit 904 can record information from the outside received via the antennas 902*a*, 902*b* on an as-needed basis. The memory unit 904 can also be composed of a first memory unit 910 storing a signal received via the antennas 902*a*, 902*b* and a second memory unit 911 storing information written by a reader/writer. A read-only memory unit can be provided by a mask ROM or a programmable ROM.

The first memory unit 910 is preferably composed of a flash memory or the like which enables successive writing and by which data does not disappear. A memory element which has a floating gate structure and which can be written only once is preferably applied.

The memory unit 904 is preferably composed of a floating gate structured memory element which enables successive writing and by which data does not disappear. Especially, a memory element which has a floating gate structure and which can be written only once is preferably applied. The wireless chip having this structure has only a function of reading out information stored in the memory unit. Simplification of a function allows downsizing and power saving of the wireless chip.

The communication circuit units 905a, 905b have demodulation circuits 912a, 912b and modulation circuits 913a, 913b, respectively. The demodulation circuits 912a, 912b demodulate a signal inputted via antennas 902a, 902b, respectively to output the demodulated signal to the arithmetic processing circuit unit 903. The signal includes information to be stored in the memory unit 904. Information read out from the memory unit 904 is output to the modulation circuits 913a, 913b, respectively, via the arithmetic processing circuit unit 903. The modulation circuits 913a, 913b modulate the signal into a signal available for wireless communication and the modulated signal is output to an external device via antennas 902a, 902b, respectively.

The antennas 902a, 902b receives an electromagnetic wave supplied from an external device referred to as a reader/writer to produce necessary electric power in the power source circuit unit 907. The antennas 902a, 902b may be appropriately designed depending on a frequency band for communication. As the frequency band of the electromagnetic wave, a long wave band up to 135 kHz, a short wave band of from 6 to 60 MHz (typically, 13.56 MHz), a ultrashort wave band of from 400 to 950 MHz, a micro wave band of from 2 to 25 GHz, or the like can be used. As an antenna for the long wave band or a short wave band, an antenna utilizing electromagnetic induction by a loop antenna is used. Besides, an antenna utilizing mutual induction (electromagnetic coupling type) or electrostatic induction (electrostatic coupling type) can be used. Electric power is generated in the power source circuit unit 907 via the antenna. The arithmetic processing circuit 903, the memory unit 904, and the communication circuit units 905a, 905b are operated by the electric power. The antenna 902a can be provided as a data communication antenna and the antenna 902b can be provided as an electric power supply antenna, respectively.

In the case that the antennas 902a and 902b can receive the same frequency band, demodulation and modulation of a signal can be carried out by one communication circuit unit (for example, the communication circuit unit 905a). In that case, the antennas 902a and 902b are preferably formed to be the same shape.

In the case that the antennas 902a and 902b can receive the different frequency bands, the antennas 902a, 902b are preferably connected to different communication circuit units 905a, 905b, respectively. In that case, the antennas 902a and 902b may be the different shapes.

According to this embodiment mode, a semiconductor device having a thin film integrated circuit can be readily manufactured and the thin film integrated circuits provided above a base insulating layer can be prevented from dispersing by removing a release layer while forming a region where a substrate and the base insulating layer adhere to each other.

The semiconductor device according to this embodiment mode has a thin film integrated circuit unit and a plurality of antennas. Therefore, even in the case of one antenna is broken, an electromagnetic wave supplied from an external device can be received by another antenna, and so durability can be improved. In the case that frequency bands available for communication by a plurality of antennas are different from each other, a plurality of frequency bands can be received, and so transmission with a different type reader/writer is possible.

EMBODIMENT MODE 2

Figure 4A:
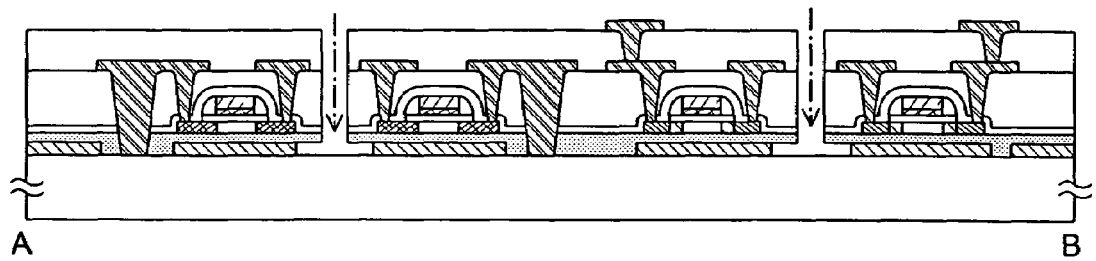
FIGS. 4A to 4D are explanatory views for showing a method for manufacturing a semiconductor device according to the present invention.
Figure 4B:
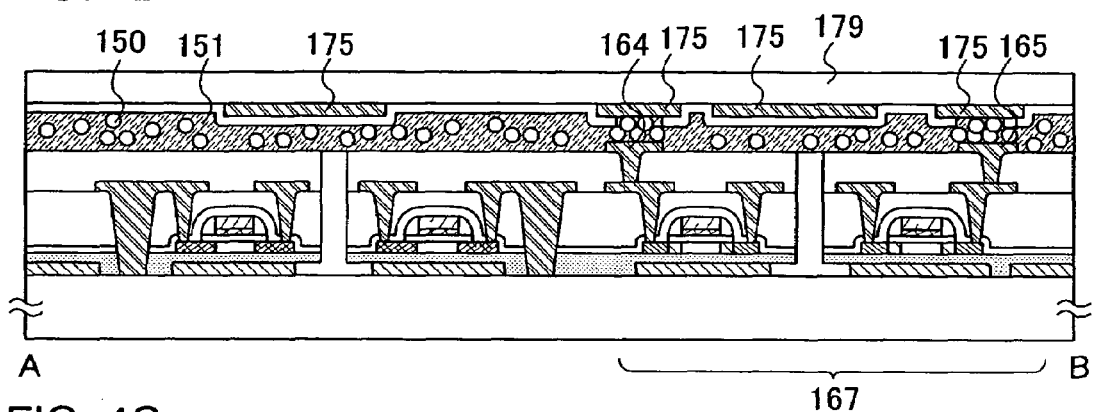
Figure 4C:
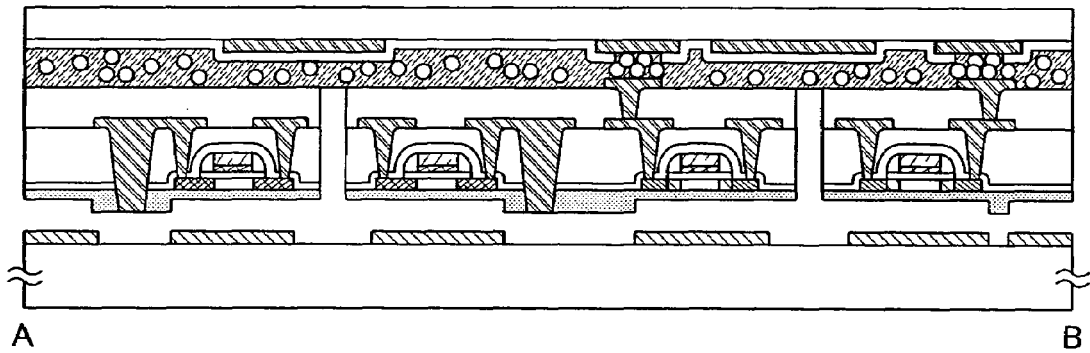
Figure 4D:
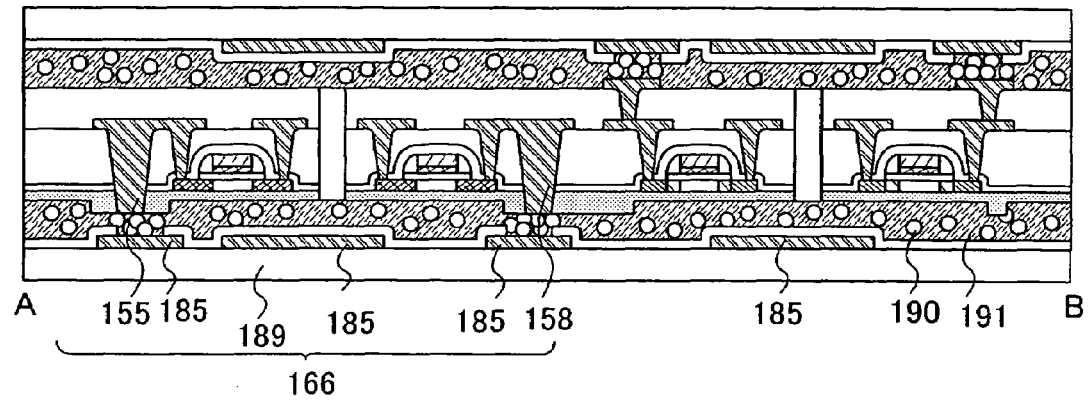

According to the foregoing embodiment mode, release layers 101 to 104 are completely removed with an etching agent (refer to FIG. 3A). However, the present invention is not limited thereto. The release layers 101 to 104 can be selectively removed (refer to FIG. 4A). Thereafter, a substrate 179 provided with a conductive layer 175 is formed over a layer having a first thin film integrated circuit 166 and a second thin film integrated circuit 167 to combine integrally the substrate and the layer. Thereafter, the layer having the first thin film integrated circuit 166 and the second thin film integrated circuit 167, and the substrate 179 provided with the conductive layer 175 may be separated from a substrate 100 by a physical means (physical force) (refer to FIG. 4C). In the case that the layer having the first thin film integrated circuit 166 and the second thin film integrated circuit 167 is separated from the substrate 100 by a physical means (physical force), there are two cases that the release layers 101 to 104 remain over the substrate 100 and that the release layers 101 to 104, the first thin film integrated circuit 166, and the second thin film integrated circuit 167 are separated from the substrate 100. This embodiment mode explained the former case (refer to FIG. 4C). The physical means (physical force) is a wind pressure of gas sprayed from a nozzle, or a means of adding a stress from the outside of an ultrasonic wave or the like.

Thin film integrated circuits can be prevented from flying and the release layers 101 to 104 can be removed in a short time by removing the release layers 101 to 104 selectively and jointly using a physical means (physical force) instead of removing the release layers 101 to 104 completely by an etching agent. Therefore, productivity can be improved.

EMBODIMENT MODE 3

In this embodiment mode, an example of bonding a substrate having a sensor instead of having either a substrate 179 having a conductive layer or a substrate 189 having a conductive layer according to Embodiment mode 1 or 2 is explained.

As the sensor, an element for detecting properties such as temperature, humidity, illuminance, gas, gravity, pressure, sound (vibration), acceleration, and others by a physical means or a chemical means can be nominated. The sensor can be formed by an element such as a resistance element, a capacitive coupling element, an inductive coupling element, a photovoltaic element, a photoelectric conversion element, a thermoelectromotive force element, a transistor, a thermistor, or a diode.

Figure 8:
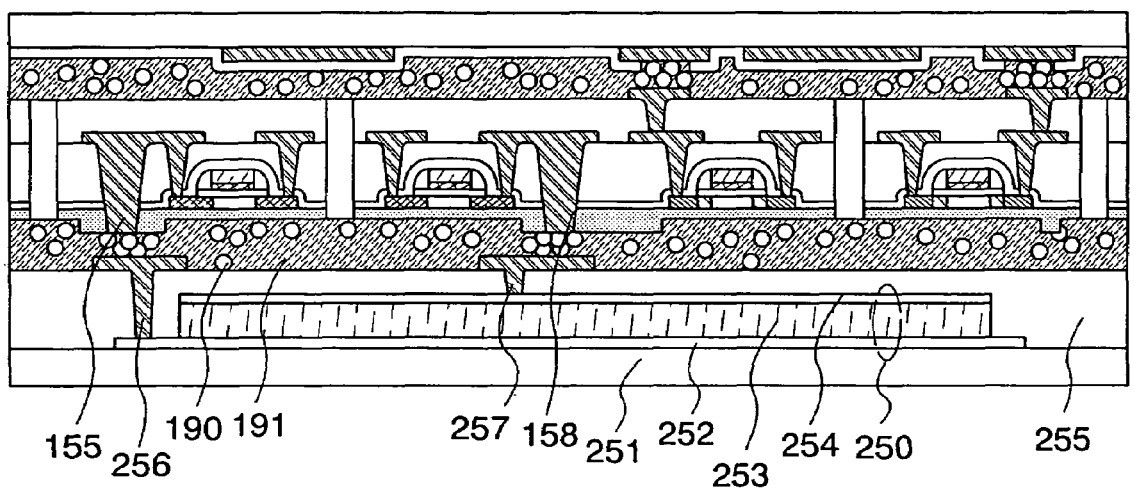
FIG. 8 is an explanatory view for showing a structure of a semiconductor device according to the present invention.

FIG. 8 is a cross-sectional view for showing a semiconductor device provided with a sensor, typically, an optical sensor, instead of a substrate 189 having a conductive layer in Embodiment 1. A photodiode 250 formed by a first electrode 252, a light receiving layer 253, and a second electrode 254 is provided over a substrate 251. Further, the photodiode 250 is covered by an interlayer insulating layer 255. The photodiode 250 is provided with a conductive layer for connection 256 connected to the first electrode 252 via the interlayer insulating layer 255 and a conductive layer for connection 257 connected to the second electrode 254 via the interlayer insulating layer 255. A layer having a first thin film integrated circuit 166 and a second thin film integrated circuit 167 is bonded to the substrate 251 so that conductive layers 155, 158 of the second thin film integrated circuit are in contact with the conductive layers 256, 257 over the substrate 251 via conductive particles 190, respectively. Besides the sensor, a sensor circuit can be provided over the substrate 251. FIG. 8 shows the semiconductor device using a photodiode; however, a phototransistor can be used instead of the photodiode. Moreover, an element which detects properties such as temperature, humidity, illuminance, gas, gravity, pressure, sound (vibration), acceleration, and others can be appropriately provided instead of the optical sensor. Moreover, instead of the conductive layers for connection 256 and 257, a conductive layer composing the sensor may be in contact with the conductive layers 155 and 158.

Figure 9:
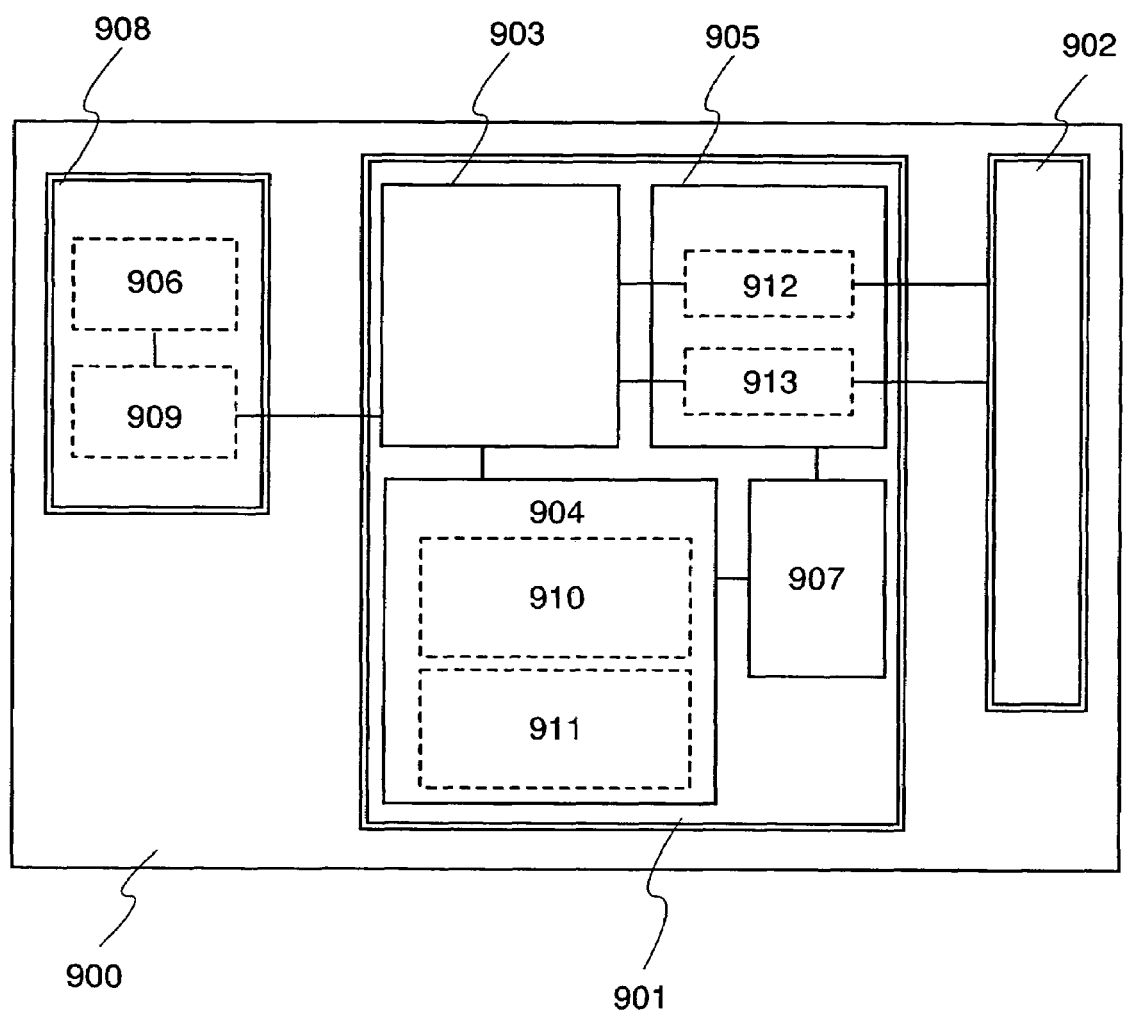
FIG. 9 is an explanatory view for showing a structure of a semiconductor device according to the present invention.

FIG. 9 shows the structure of a wireless chip 900 provided with a thin film integrated circuit 901, a sensor assembly 908, and an antenna 902. The sensor assembly 908 detects properties such as temperature, humidity, illuminance, gas, gravity, pressure, sound (vibration), acceleration, and others by a physical or chemical means. The sensor assembly 908 includes a sensor 906 and a sensor circuit 909 for controlling the sensor 906. The sensor 906 is formed by an element such as a resistance element, a capacitive coupling element, an inductive coupling element, a photovoltaic element, a photoelectric conversion element, a thermoelectromotive force element, a transistor, a thermistor, or a diode. The sensor circuit 909 detects the change in impedance, reactance, inductance, voltage, or current, and analog-digital converts (A/D conversion) the detected information, then, outputs a signal to an arithmetic processing circuit 903.

The thin film integrated circuit 901 has the arithmetic processing circuit 903, a memory unit 904, a communication circuit unit 905, and a power source circuit unit 907. The memory unit 904 can record information from the outside received via the sensor assembly 908 and the antenna 902 on an as-needed basis. The memory unit 904 can be composed of two divided memory units of a first memory unit 910 for storing a signal detected by the sensor assembly 908 and a second memory unit 911 for recording information written by a reader/writer.

In order to record information detected by the sensor assembly 908, the first memory unit 910 is preferably composed of a flash memory which enables successive writing and by which data is not disappeared. A memory element which has a floating gate structure and which can be written only once is preferably applied.

The communication circuit unit 905 has a demodulation circuit 912 and a modulation circuit 913. The demodulation circuit 912 demodulates a signal inputted via the antenna 902 to output the signal to the arithmetic circuit unit 903. The signal includes a signal for controlling the sensor assembly 908 and information for being stored in the memory unit 904 through the arithmetic processing circuit 903. A signal output from the sensor circuit 909 and information read out from the memory unit 904 are output to the modulation circuit 913 via the arithmetic processing circuit unit 903. The modulation circuit 913 modulates the signal into a signal available for wireless communication and the modulated signal is output to an external device via the antenna 902.

The electric power necessary to operate the arithmetic processing circuit 903, the sensor assembly 908, the memory unit 904, and the communication circuit unit 905 is supplied via the antenna 902.

According to this embodiment mode, a semiconductor device having a thin film integrated circuit can be readily manufactured and the thin film integrated circuits provided above a base insulating layer can be prevented from dispersing by removing a release layer while forming a region where a substrate and the base insulating layer adhere to each other.

The semiconductor device according to the present invention has a thin film integrated circuit unit, an antenna, and a sensor. After processing information detected by the sensor by the thin film integrated circuit unit, the information can be stored. Further, the detected information by the sensor can be converted to signals and the signals can be output to a reader/writer via the antenna. Therefore, a semiconductor device added with higher value than that of the conventional semiconductor device such as a wireless chip.

EMBODIMENT MODE 4

In the foregoing embodiment modes, a semiconductor device which serves as a wireless chip is explained; however, the present invention is not limited to this mode. In this embodiment mode, a semiconductor device having a different structure from the foregoing structure is explained.

Figure 18A:
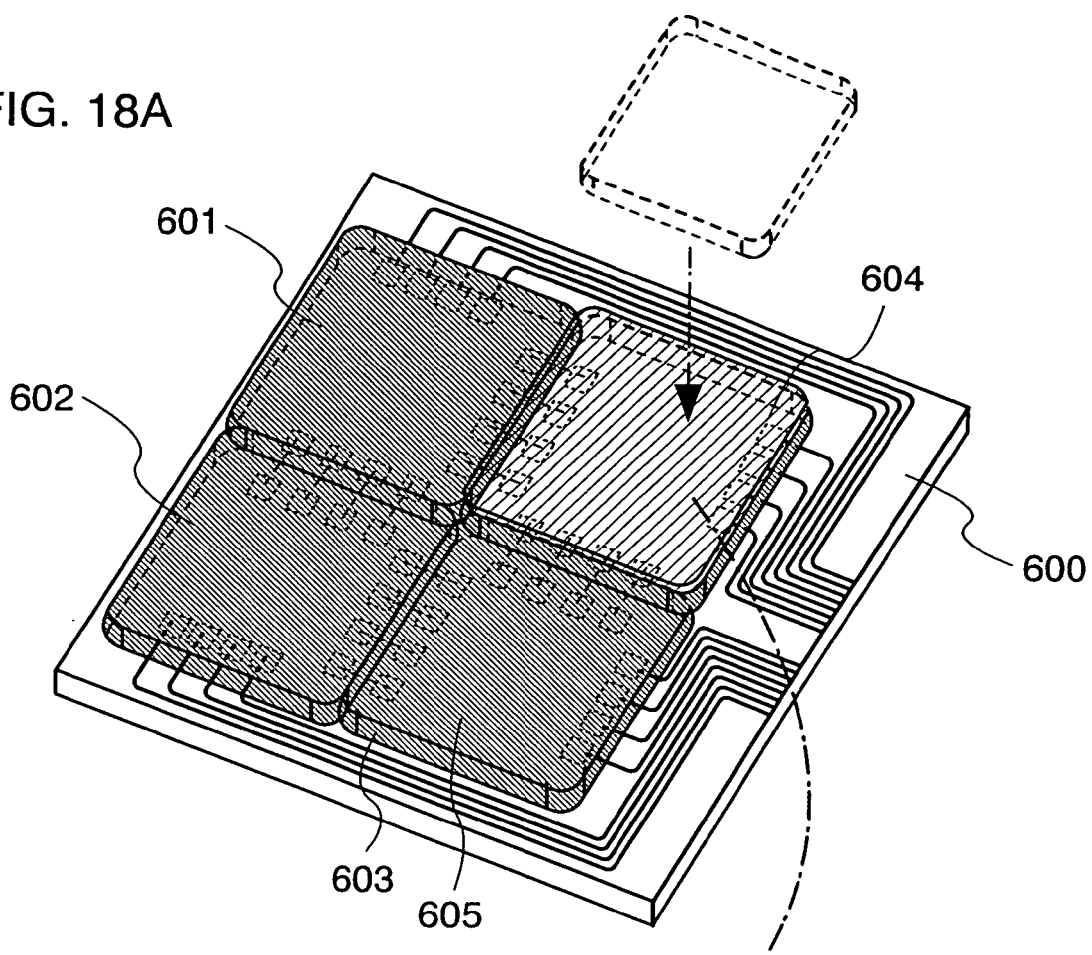
FIGS. 18A and 18B are explanatory views for showing a structure of a semiconductor device according to the present invention.
Figure 18B:
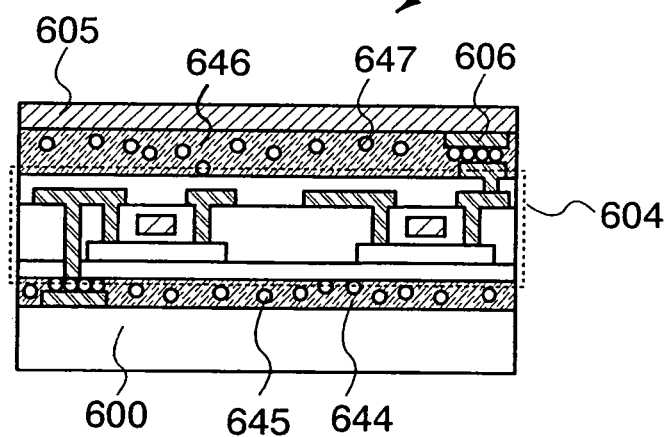

Firstly, a semiconductor device in which a plurality of functions are integrated according to the present invention is explained (refer to FIGS. 18A and 18B). A plurality of thin film integrated circuits 601 to 604 are bonded over the substrate 600 provided with a conductive layer. The conductive layer over the substrate 600 is bonded to a conductive layer for connection over either surface of each of the thin film integrated circuits 601 to 604 with resin 644 including conductive particles 645. Each of the thin film integrated circuits 601 to 603 serves as one or more selected from the group consisting of a central processing unit (CPU), a memory, a network processing circuit, a disk processing circuit, an image processor, and a voice processor. The thin film integrated circuit 604 can be provided with a thin film integrated circuit according to Embodiment modes 1 to 3. Here, an example that the thin film integrated circuit 604 has one antenna and one thin film integrated circuit is described. A conductive layer for connection over the other surface of the thin film integrated circuit 604 is bonded to a conductive layer for connection 606 of the substrate 605 having a conductive layer such as an antenna with resin 646 including conductive particles 647.

Figure 19A:
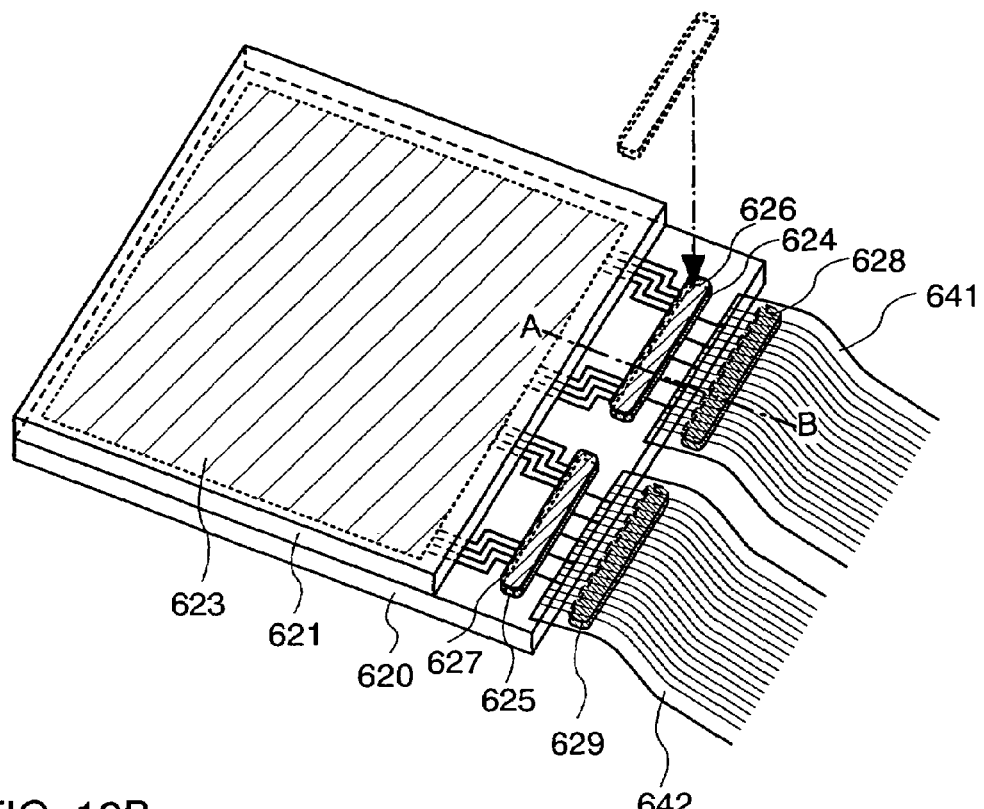
FIGS. 19A and 19B are explanatory views for showing a structure of a semiconductor device according to the present invention.
Figure 19B:
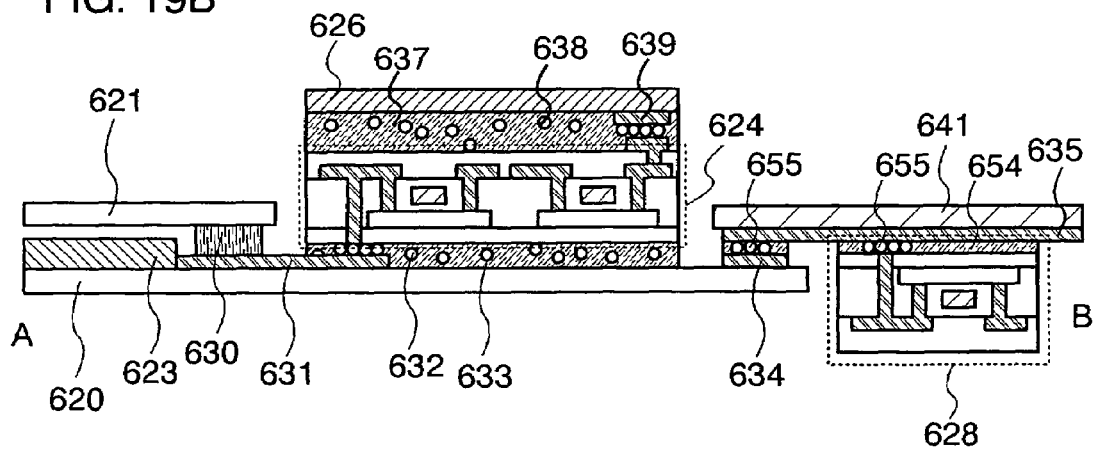

A semiconductor device having a display portion according to the present invention is explained (refer to FIGS. 19A and 19B in which line A-B in FIG. 19A corresponds to line A-B in FIG. 19B). Thin film integrated circuits 624, 625 are bonded over a substrate 620, whereas the thin film integrated circuits 628, 629 are bonded over connection films 641, 642. As the thin film integrated circuits 624, 625, thin film integrated circuits according to Embodiment modes 1 to 3 can be used. Here, an example that the semiconductor device has one antenna and one thin film integrated circuit is described.

A display portion 623 is connected to a conductive layer for connection over a reverse surface of the thin film integrated circuit 624 via a conductive layer 631 over the substrate 620. A conductive layer for connection over a surface of the thin film integrated circuit 624 is bonded to a conductive layer for connection 639 of a substrate 626 having a conductive layer such as an antenna with resin 637 including conductive particle 638.

The thin film integrated circuit 624 is connected to a thin film integrated circuit 628 via a conductive layer 634 over the substrate 620 and a conductive layer 635 over the connection film 641. For connecting the conductive layers, resin 654 including conductive particles 655 is used. Further, a substrate 620 and an opposing substrate 621 are bonded to each other with sealant 630.

Figure 20A:
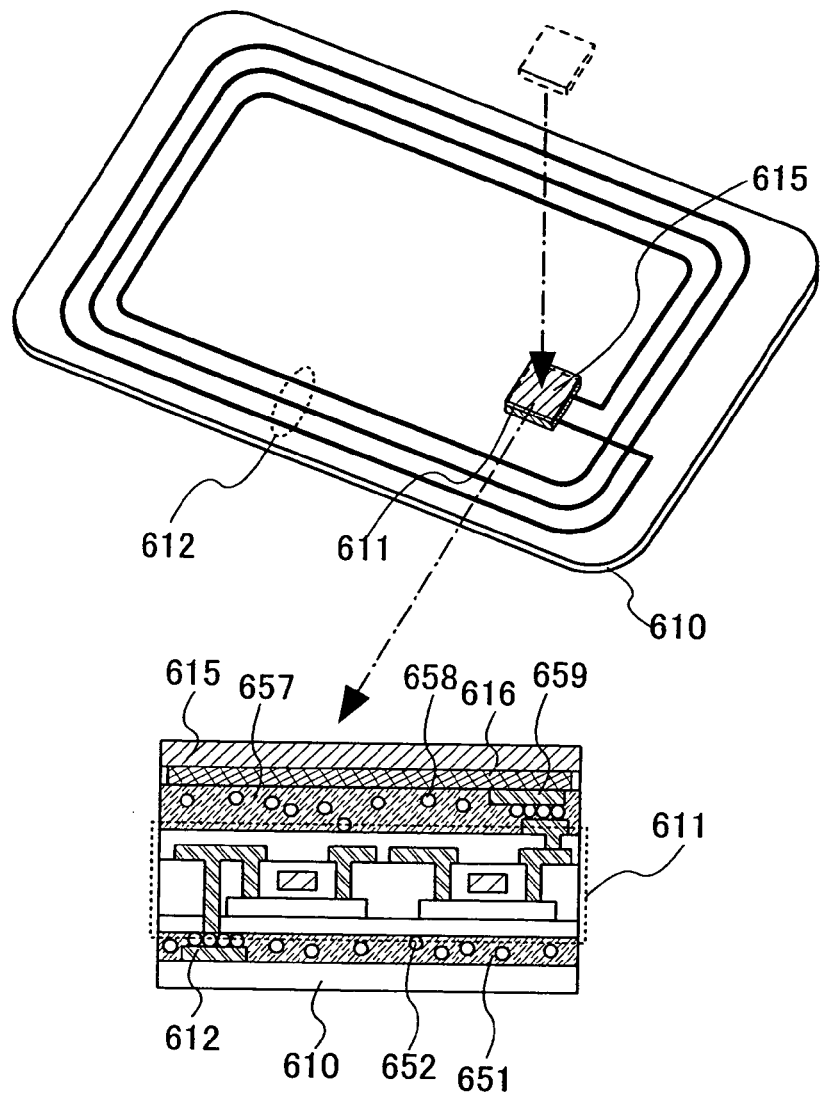
FIGS. 20A and 20B are explanatory views for showing a structure of a semiconductor device according to the present invention.
Figure 20B:
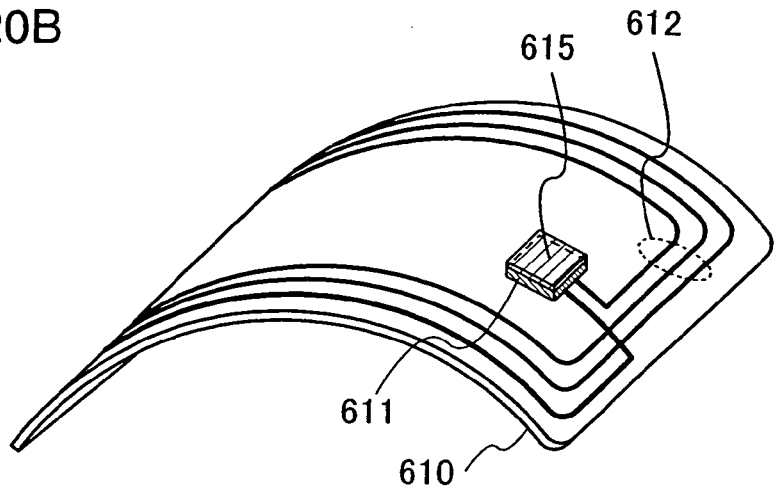

A semiconductor device serving as an IC card according to the present invention is explained (refer to FIGS. 20A and 20B). A thin film integrated circuit 611 is bonded over a substrate 610. As the thin film integrated circuit 611, the thin film integrated circuit according to Embodiment modes 1 to 3 can be provided. Here, an example that the semiconductor device has a sensor and a thin film integrated circuit is described. A conductive layer 612 over the substrate 610 is bonded to a conductive layer for connection over the reverse surface of the thin film integrated circuit 611 with resin 651 including conductive particles 652. A conductive layer for connection over a surface of the thin film integrated circuit 611 is bonded to a conductive layer for connection 659 of a substrate 615 with resin 657 including conductive particles 658.

Thin film integrated circuits included in the semiconductor device according to the present invention are small, thin, and lightweight. By using the thin film integrated circuits for each of a semiconductor device having a plurality of system (refer to FIG. 18), a semiconductor device having a display function, and an IC card (refer to FIG. 20), the thin film integrated circuits can be increasingly sophisticated and added with highly value.

EMBODIMENT 1

In this embodiment, a method for forming a minute conductive layer is explained (refer to FIG. 10).

Firstly, release layers 101 to 104, an insulating layer 105, crystalline semiconductor layers 127 to 130, a gate insulating layer 106, and conductive layers 271, 272 are formed over a substrate 100 having an insulating surface. Then, resist masks 273 to 276 are formed over the conductive layers 271, 272 using a photomask (refer to FIG. 10A).

Figure 10A:
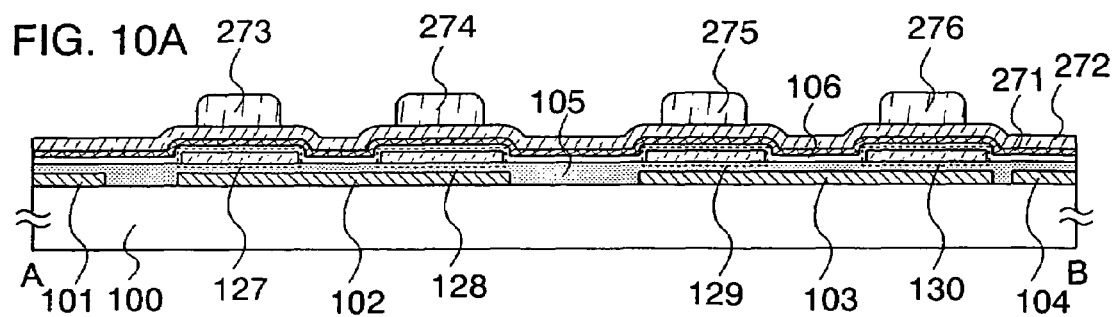
FIGS. 10A to 10C are explanatory views for showing a method for manufacturing a semiconductor device according to the present invention.
Figure 10B:
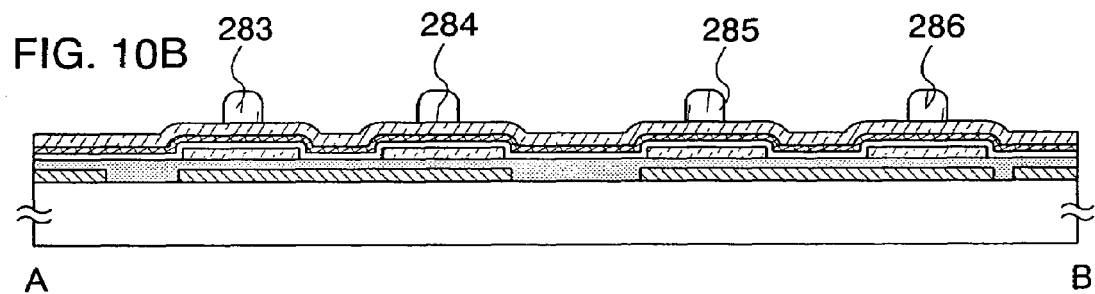

Novel resist masks 283 to 286 are formed by etching the resist masks 273 to 276 by known etching treatment such as oxygen plasma treatment (refer to FIG. 10B). The resist masks 283 to 286 through the foregoing processes can be formed finely which exceeds the formation limit by a photolithography method.

Figure 10C:
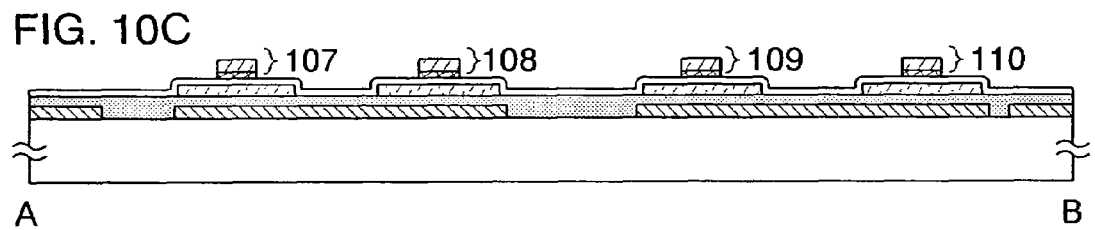

Etching treatment using the resist masks 283 to 286 can manufacture minute conductive layers 107 to 110 (refer to FIG. 10C). The conductive layers 107 to 110 serve as gate electrodes.

As a different method from the foregoing, the release layers 101 to 104, the insulating layer 105, the crystalline semiconductor layers 127 to 130, the gate insulating layer 106, the conductive layers 271, 272, and the resist masks 273 to 276 are formed over the substrate 100 having an insulating surface (refer to FIG. 10A).

Figure 11A:
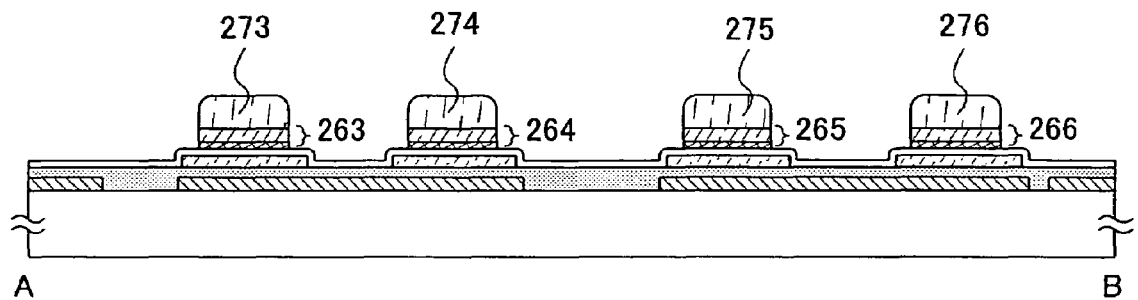
FIGS. 11A to 11C are explanatory views for showing a method for manufacturing a semiconductor device according to the present invention.

Conductive layers 263 to 266 are formed by etching the conductive layers 271, 272 by using the resist masks 273 to 276 (refer to FIG. 11A).

Figure 11B:
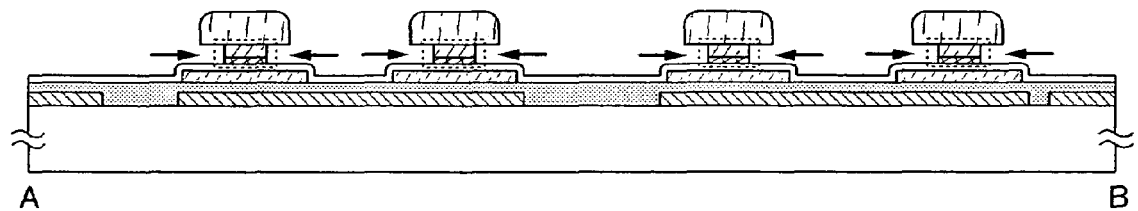
Figure 11C:
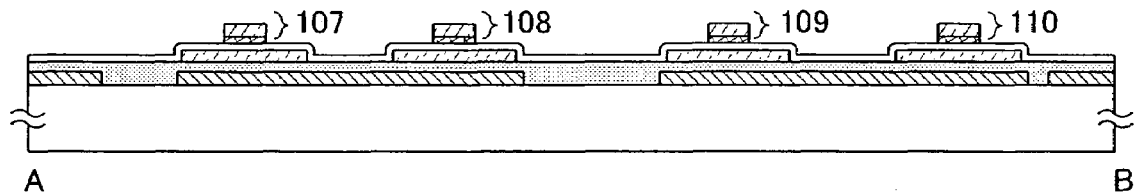

Only the sides of the conductive layers 263 to 266 are selectively etched while being the resist masks 273 to 276 not removed (refer to FIG. 11B). As an etching method used for the etching, an isotropic etching method or a wet etching method can be used. Accordingly, the minute conductive layers 107 to 110 which exceed the formation limit by a photolithography method can be formed as with the foregoing method (refer to FIG. 11C). The conductive layers 107 to 110 serve as gate electrodes.

By using any one of the foregoing methods, a minute thin film transistor having a channel length of 0.5 µm or less can be formed. A minute thin film transistor can bring about high integration, and so a semiconductor device in which an element is offered technical advantages can be manufactured. Further, high speed operation can be realized since the width of a channel region becomes decreased.

EMBODIMENT 2

A wireless chip is supplied with a power source from an antenna, and so it is difficult to stabilize a power source and power consumption is required to reduce as much as possible. In case that the power consumption of the wireless chip is increased, an electronic wave is required to be strongly input which leads to the increase of power consumption of a reader/writer, adverse effects on the other device or human body, and limitation on a communication distance between the wireless chip and the reader/writer.

Figure 12:
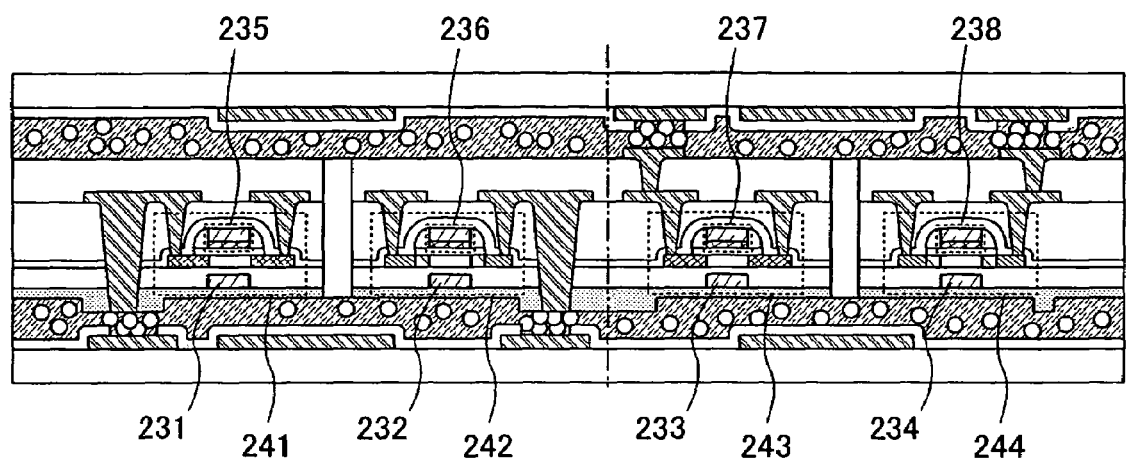
FIG. 12 is an explanatory view for showing a structure of a semiconductor device according to the present invention.

According to the present invention, a semiconductor device using N-type thin film transistors 242, 244, each of which includes either of bottom gate electrodes 232, 234 and either of top gate electrodes 236, 238, and P-type thin film transistors 241, 243, each of which includes either of bottom gate electrodes 231, 233 and either of top gate electrodes 235, 237 (refer to FIG. 12).

In order to reduce power consumption, a method for applying bias voltage to the bottom gate electrodes 231 to 234. Specifically, applying negative bias voltage to the bottom gate electrodes 232, 234 of the N-type thin film transistors 242, 244 can increase threshold voltage and reduce leak current. Further, applying positive bias voltage can reduce threshold voltage to make current easier to flow in a channel formation region. Therefore, the thin film transistor 242, 244 can be operated at higher speed or lower voltage than ever before.

Applying positive bias voltage to the bottom gate electrodes 231, 233 of the P-type thin film transistors 241, 243 can increase threshold voltage and reduce leak current. Further, applying negative bias voltage can reduce threshold voltage to make current easier to flow in a channel formation region. Therefore, the thin film transistors 241, 243 can be operated at higher speed or lower voltage than ever before.

Accordingly, the threshold voltage of the thin film transistors 241 to 244 is changed and the leak current is reduced by controlling the bias voltage for being applied to the bottom gate electrodes. As a result, power consumption of the wireless chip itself can be reduced. Therefore, a power source does not become unstable even if performing complicated processing such as encryption, accordingly, the stabilization of a power source can be realized. Further, an electromagnetic wave is not required to be input and communication distance between the wireless chip and the reader/writer can be improved.

The application of bias voltage to the thin film transistors 241 to 244 may be controlled by providing a special control circuit.

EMBODIMENT 3

Figure 13A:
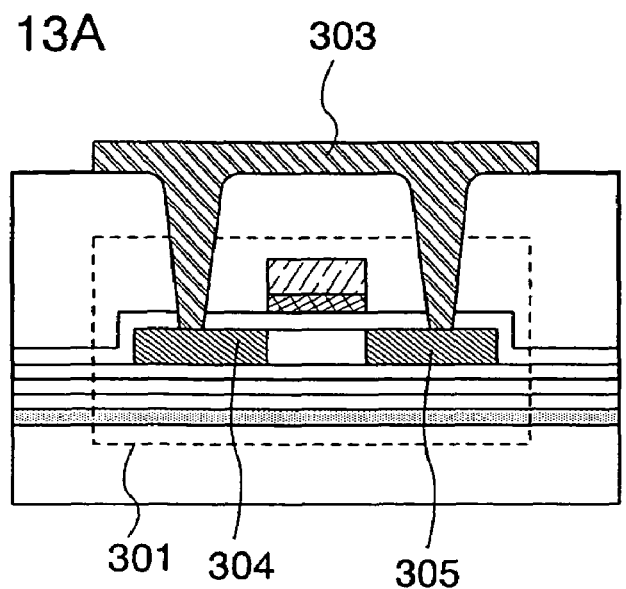
FIGS. 13A to 13D are explanatory views for showing a semiconductor device according to the present invention.
Figure 13B:
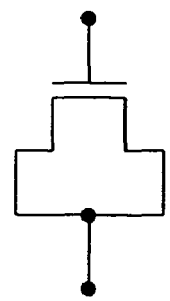

A cross-sectional structure of a capacitance transistor used for the semiconductor device according to the present invention is explained (refer to FIG. 13A). In the capacitance transistor 301, a source electrode and a drain electrode are connected to each other. That is, a source region 304 and a drain region 305 are connected each other by a conductive layer 303. Accordingly, when the capacitance transistor 301 is turned on, capacity is formed between a gate electrode and a channel formation region. The cross-sectional structure of the capacitance transistor 301 is similar to that of a general thin film transistor. An equivalent circuit diagram is illustrated as FIG. 13B.

Figure 13C:
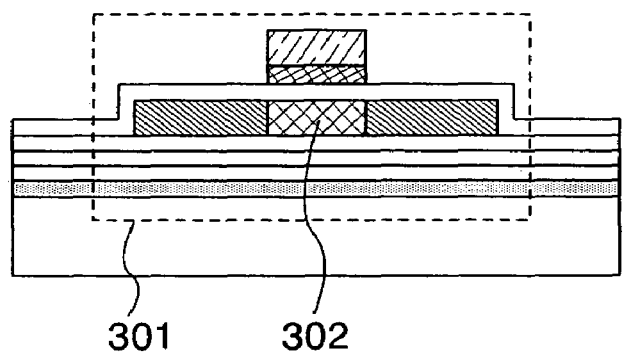
Figure 13D:
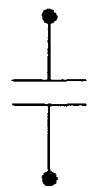

Since a gate insulating film is used for forming the capacity, the capacitance value may be affected by variation of threshold voltage of the capacitance transistor 301. Therefore, a capacitance transistor 301 added with impurity elements may be used in a region 302 overlapped with the gate electrode (refer to FIG. 13C). The capacitance transistor having the foregoing structure is provided with capacity independently of threshold voltage of the transistor, and so the effects of threshold voltage variation of the transistor can be prevented. An equivalent circuit diagram in that case is illustrated as FIG. 13D.

EMBODIMENT 4

Figure 26A:
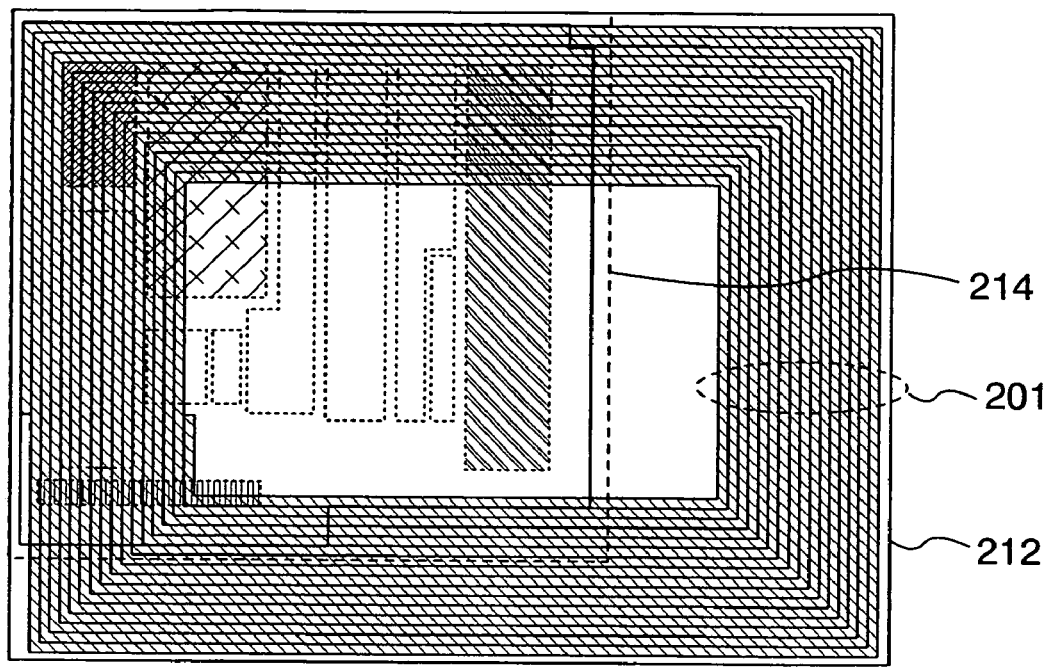
FIGS. 26A and 26B are explanatory views for showing a structure of a semiconductor device according to the present invention.

An example of the layout of the wireless chip described in Embodiment modes 1, 2 is explained with reference to FIG. 26. Firstly, an overall layout of one wireless chip is explained (refer to FIG. 26A). In the wireless chip, a first antenna 201, an element group 214 constructing a power source unit and a logic unit, and a second antenna (not shown) are formed over different layers, respectively. Specifically, the first antenna 201 is formed over the element group 214. A part of a region for forming the first antenna 201 is overlapped with a part of a region for forming the element group 214. In the illustrated structure, a wiring for constructing the first antenna 201 is formed to have a width of 150 μm, wirings are formed to have intervals between them of 10 μm, and the number of windings is 15. The first antenna 201 is not restricted to a winding form as illustrated in FIGS. 26A and 26B. The form of the first antenna 201 may be either of a curved form (refer to FIG. 27A) or a straight form (refer to FIG. 27B).

A second antenna (not shown) is provided to the opposite side of the first antenna via the element group 214. The second antenna can be formed into either of a winding form, a curved form or a straight form as with the first antenna.

Figure 26B:
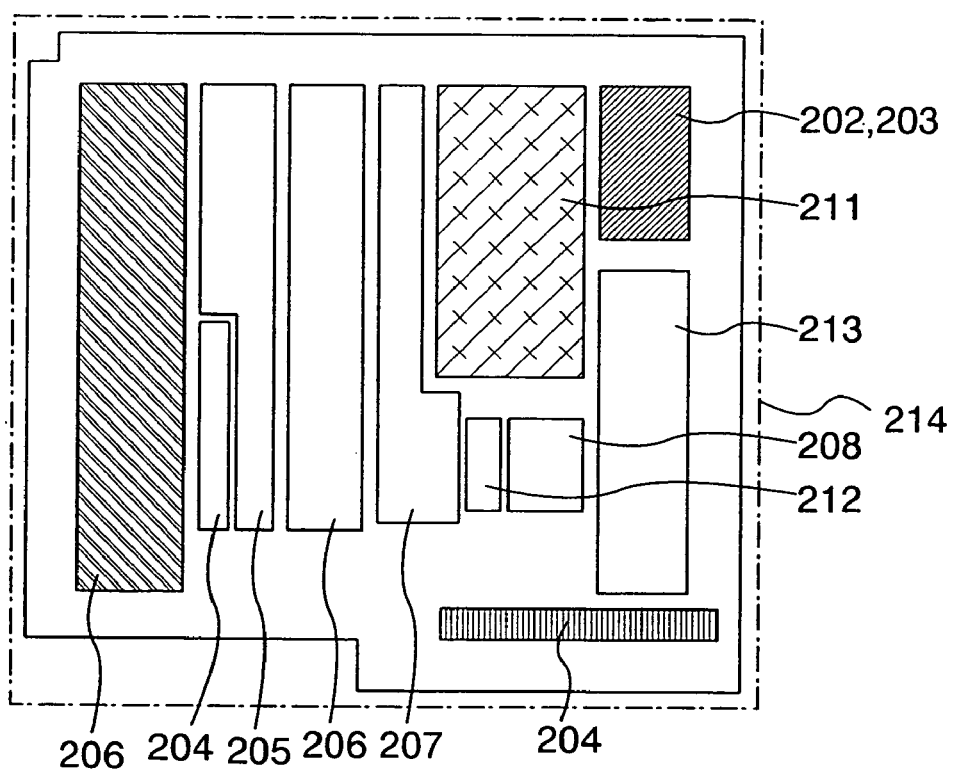
Figure 27A:
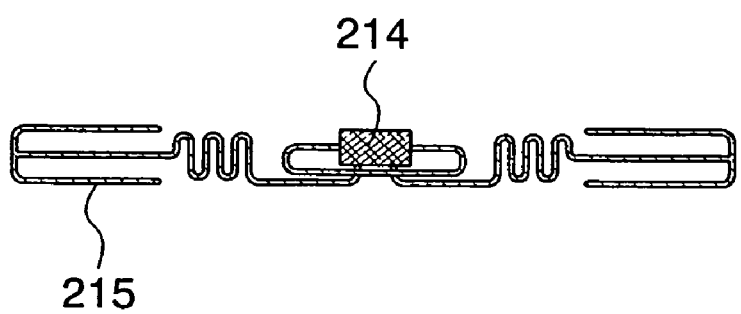
FIGS. 27A and 27B are explanatory views for showing a structure of a semiconductor device according to the present invention.
Figure 27B:
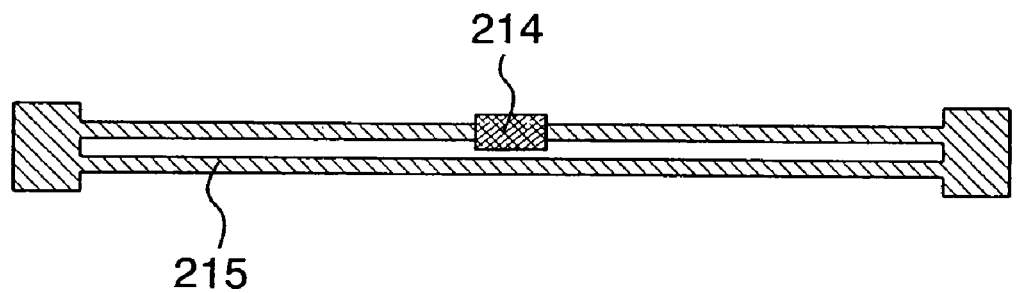

The layout of the element group 214 which constructs a power source unit and a logic unit (refer to FIG. 26B). A rectification circuit 202 and a retention capacity 203 which construct the power source unit are provided in the same region. The logic unit has demodulation circuits 204, a clock generation and correction circuit 205, recognition and determination circuits for each code 206, a memory controller 207, and a modulation circuit comprising modulation resistance 208. The demodulation circuits 204 and recognition and determination circuits for each code 206 are provided at two positions, respectively. A mask ROM 211 and the memory controller 207 are provided adjacently. The clock generation and correction circuit 205 and the recognition and determination circuits for each code 206 are provided adjacently. One of the demodulation circuits 204 is provided between the clock generation and correction circuit 205 and the recognition and determination circuits for each code 206. Detection capacity 212 for the logic unit and detection capacity 213 for the power source unit are provided. The modulation circuit comprising modulation resistance 208 is provided between the detection capacity 212 and the detection capacity 213.

The mask ROM 211 forms a memory content in a memory during a manufacturing process. Here, a power source line connected to a high potential power source (also referred to as VDD) and a power source line connected to a low potential power source (also referred to as VSS) are provided, and the memory content stored in a memory cell is judged by the fact that a transistor included in each memory cell is connected to which the foregoing power sources.

EMBODIMENT 5

Figure 15A:
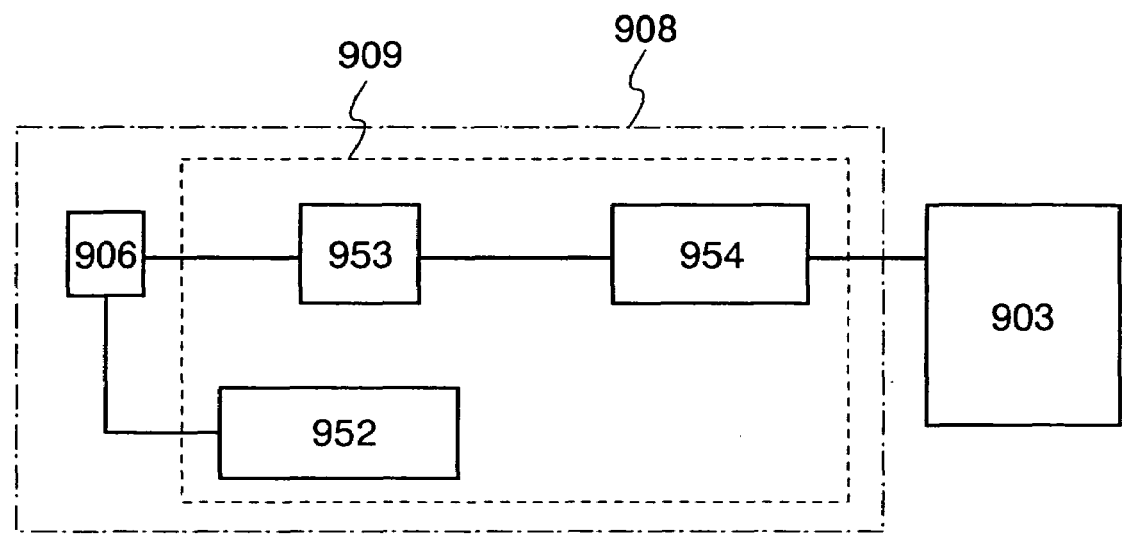
FIGS. 15A and 15B are explanatory views for showing a structure of a semiconductor device according to the present invention.

FIG. 15A illustrates an example of a sensor assembly which is a detecting unit for detecting surrounding brightness or light irradiation in a wireless chip. The sensor assembly 908 has a sensor 906 and a sensor circuit 909. The sensor 906 is formed by a photodiode, a phototransistor, or the like. The sensor circuit 909 includes a sensor driving circuit 952, a detecting circuit 953, and an A/D conversion circuit 954.

Figure 15B:
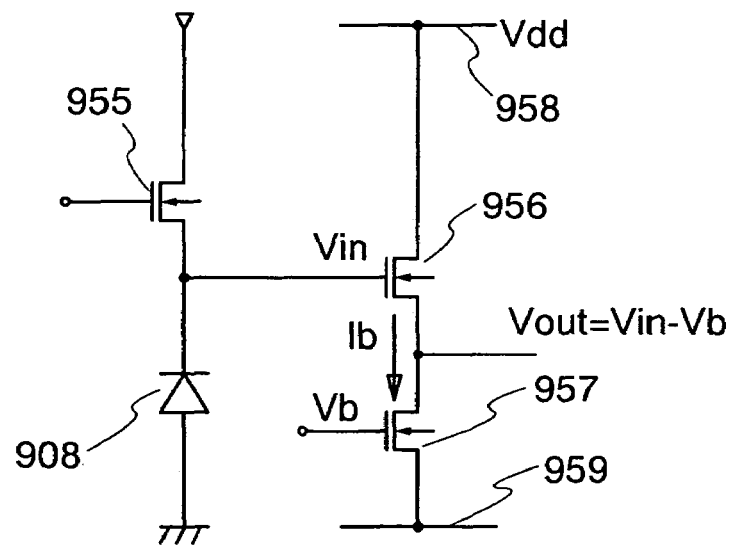

FIG. 15B is an explanatory circuit diagram for showing a detecting circuit 953. When a reset TFT 955 is made into a conductive state, the sensor 906 is applied with a negative bias voltage. Here, an operation of being potential at a negative side terminal of the sensor 906 charged to potential of power source voltage is referred to as reset. Thereafter, the reset TFT 955 is made into a non-conductive state. At this time, a potential state is changed with time due to electro motive force of the sensor 906. That is, the potential at a negative side terminal of the sensor 906 charged to the potential of power source voltage is gradually decreased due to charges generated by photoelectric conversion. After a certain period of time, a signal is output to an output side passing through an amplifying TFT 956 when a bias TFT 957 is made into a conductive state. In that case, the amplifying TFT 956 and the bias TFT 957 serve as so-called source follower circuits. FIG. 15B illustrates an example of forming the source follower circuit by an n-channel TFT. However, the source follower circuit can be formed by a p-channel TFT. An amplify side power source line 958 is added with power source voltage Vdd. A bias side power source line 959 is applied with reference potential of 0 volt. A drain side terminal of the amplifying TFT 956 is connected to the amplify side power source line, whereas a source side terminal is connected to a drain terminal of the bias TFT 957. A source side terminal of the bias TFT 957 is connected to a bias side power source line 959. A gate terminal of the bias TFT 957 is applied with bias voltage Vb, and bias current Ib flows through the TFT. The bias TFT 957 basically serves as a constant current source. A gate terminal of the amplifying TFT 956 is added with input voltage Vin and a source terminal serves as an output terminal. The source follower circuit has an input and output relationship of Vout=Vin−Vb. The output voltage Vout is converted into a digital signal by the A/D conversion circuit 954. The digital signal is output to an arithmetic processing circuit 903.

Figure 16:
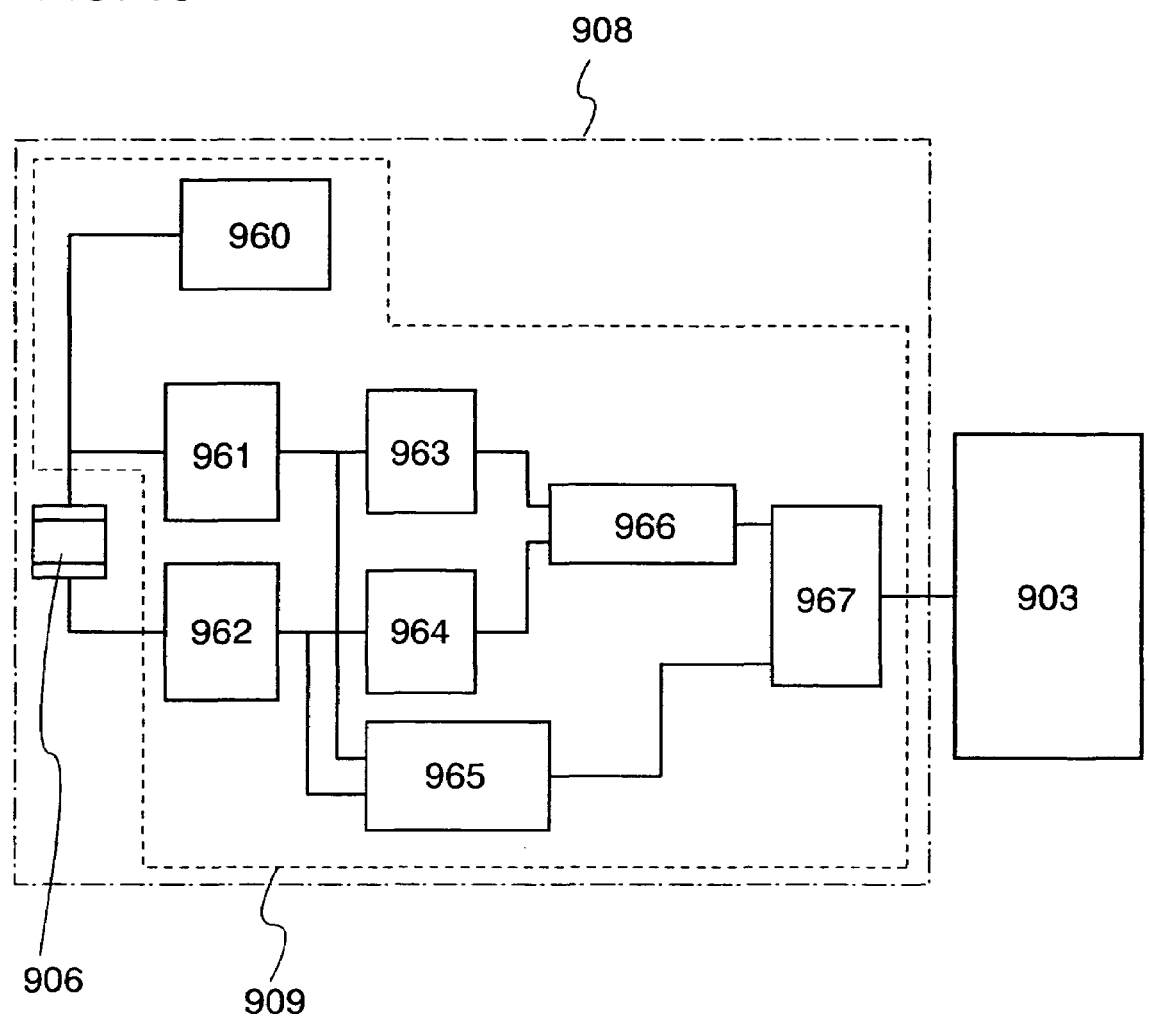
FIG. 16 is an explanatory view for showing a structure of a semiconductor device according to the present invention.

FIG. 16 is an example of providing an element for detecting electrostatic capacity to the sensor 906. The element for detecting electrostatic capacity has a pair of electrodes. An object for detecting liquid or gas fills between the pair of electrodes. By detecting the change in electrostatic capacity between the pair of electrodes, the state of contents sealed in a container is judged. Further, the change in humidity can be detected by reading out minute change of electric resistance by interposing polyimide, acrylic, or a hygroscopic dielectric material between the pair of electrodes.

The sensor circuit 909 has the following structure. A pulse generator (oscillation circuit) 960 generates a reference signal for measurement to input the signal to an electrode of the sensor 906. Voltage is also input to a voltage detection circuit 961. A reference signal detected by the voltage detection circuit 961 is converted into a voltage signal which shows an effective value by a conversion circuit 963. Current flowing between electrodes of the sensor 906 is detected by a current detection circuit 962. A signal detected by the current detection circuit 962 is converted into a current signal which shows effective value by a conversion circuit 964. An arithmetic circuit 966 calculates an electric parameter such as impedance or admittance by arithmetic processing of the voltage signal which is output of the conversion circuit 963 and the current signal which is output of the conversion circuit 964. Output of the voltage detection circuit 961 and output of the current detection circuit 962 are input to a phase comparator circuit 965. The phase comparator circuit 965 outputs the phase difference between both of the signals to an arithmetic circuit 967. The arithmetic circuit 967 calculates electrostatic capacity by using output signals of the arithmetic circuit 966 and the phase comparator circuit 965. Then, the signals are output to the arithmetic processing circuit 903.

Figure 17:
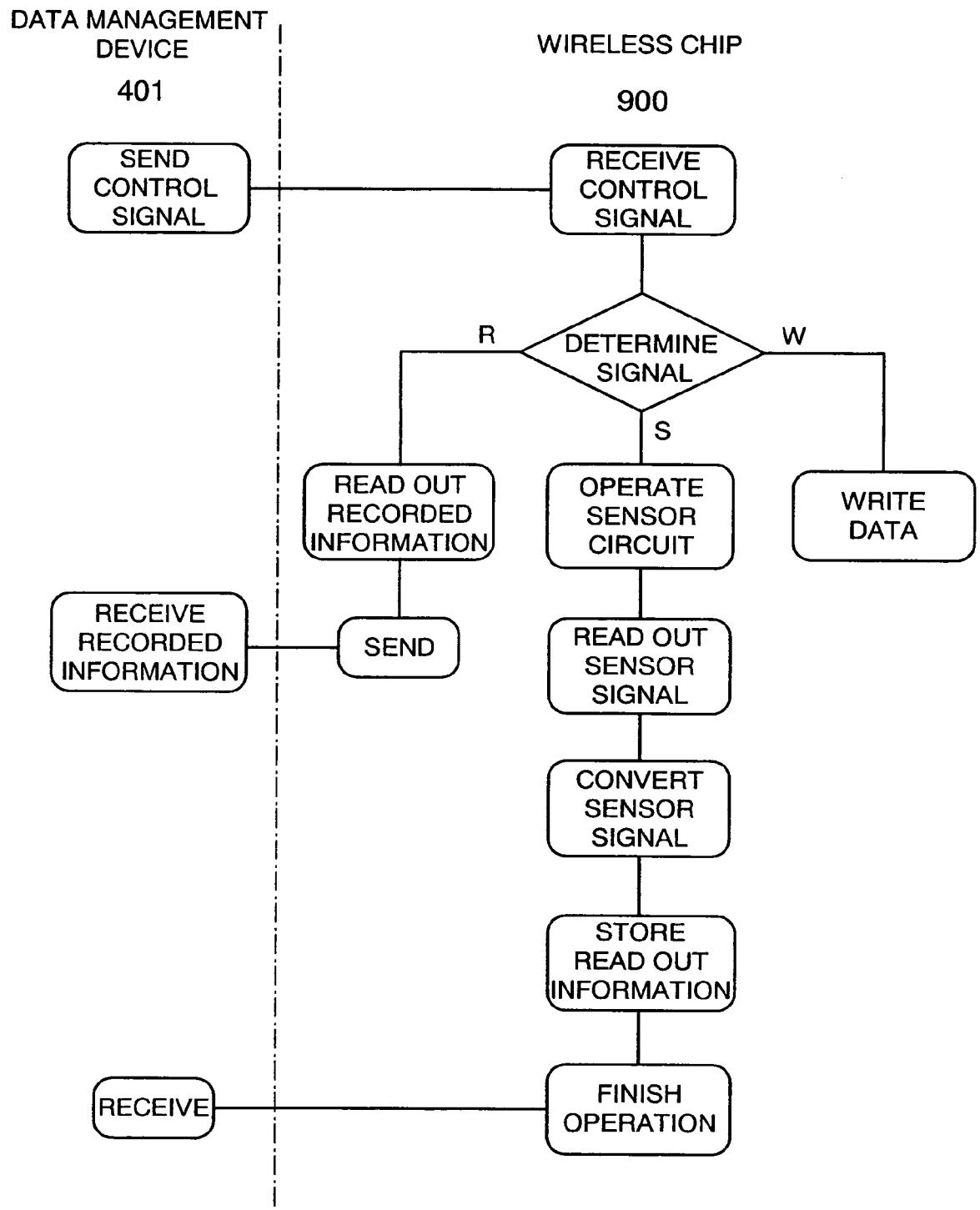
FIG. 17 is an explanatory view for showing an operation of a semiconductor device according to the present invention.

FIG. 17 is an explanatory flow chart for showing operation of a data management device 401 and a wireless chip 900. The data management device 401 sends control signals such as a sensor seizing signal, a data read out signal, and a data writing signal. The wireless chip 900 receives the control signals. The wireless chip 900 identifies the control signals by an arithmetic processing circuit. Then, the sensor assembly 908 is operated to determine which operation will be performed among operation of measuring and recording of data, operation of reading out data stored in a memory unit, and operation of writing data into the memory unit. The operation of measuring and recording of data operates the sensor circuit, reads out a signal of sensor, binarizes the signal via the sensor circuit, and stores the signal to the memory unit. The operation of writing data writes data sent from the data management device 401 into the memory unit 904. The operation of reading out data stored in the memory unit reads out data stored in the memory unit 904 and sends the data to the data management device 401. Electrical power required for the operation of the circuit is supplied simultaneously with sending the signal or as needed.

Figure 25:
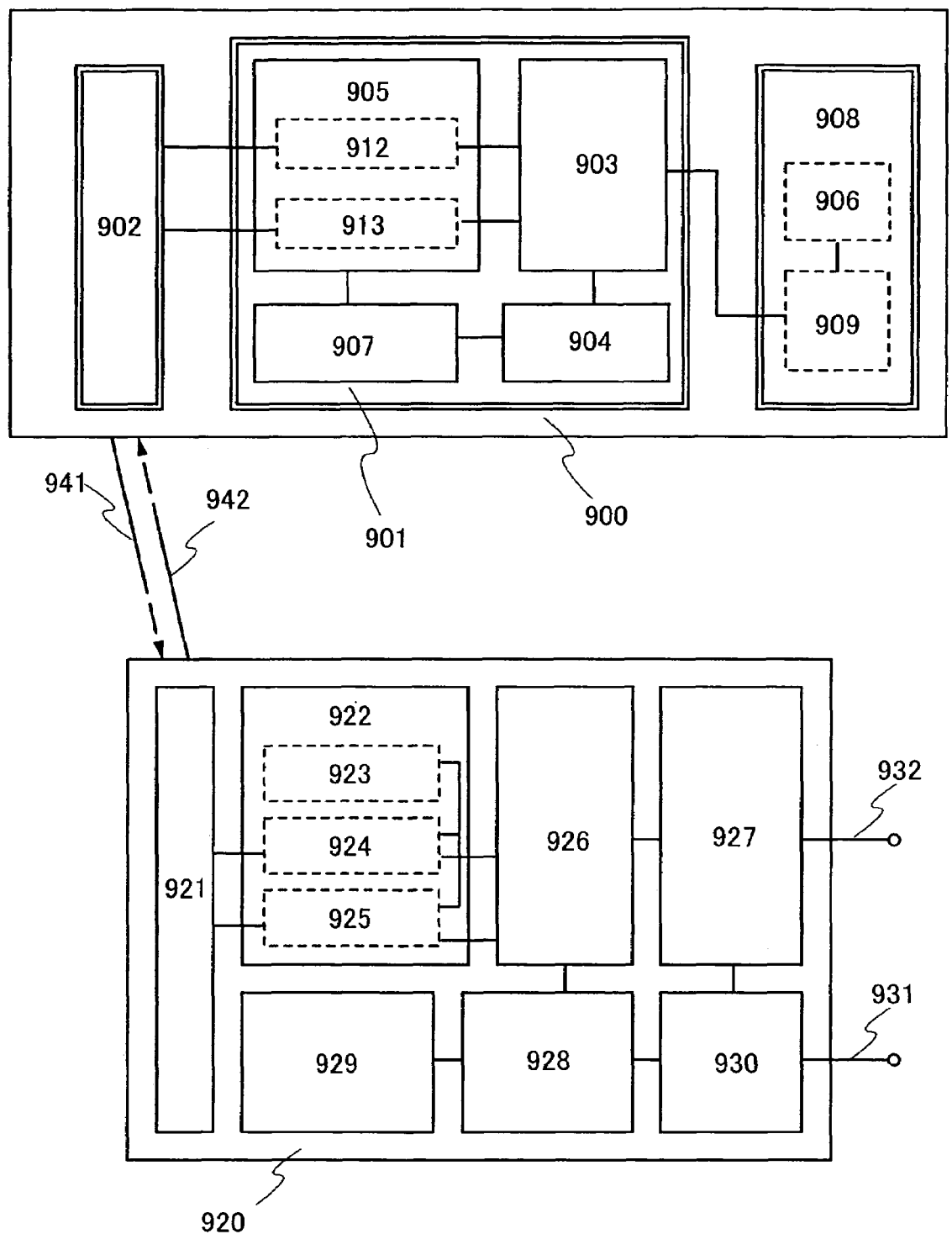
FIG. 25 is an explanatory view for showing a structure of a semiconductor device according to the present invention.

A system of sending and receiving information detected by the sensor of the wireless chip (hereinafter, sensor detected information) between the wireless chip and the reader/writer is explained with reference to FIG. 25. FIG. 25 illustrates examples of the wireless chip 900 which is the semiconductor device according to the present invention and a reader/writer 920 which sends and receives information on the wireless chip 900. The reader/writer 920 includes a communication circuit unit 922 having an antenna 921, a transmitter 923, a demodulation circuit 924, and a modulation circuit 925. Besides, the reader/writer 920 includes an arithmetic processing circuit unit 926 and an external interface unit 927. In order to send and receive an encrypted control signal, an encryption and decryption circuit unit 928 and a memory unit 929 may be provided to the reader/writer 920. A power source circuit unit 930 is a circuit unit which supplies electric power to each circuit. The power source circuit unit 930 supplies electric power supplied from an external power source 931 to each circuit.

Information detected by a sensor assembly 908 in the wireless chip 900 is processed by the arithmetic processing circuit unit 903 and stored in the memory unit 904. A signal 942 sent as an electronic wave via a conversion circuit 925 of the reader/writer 920 is converted into an alternating electric signal by electromagnetic induction in an antenna 902 of the wireless chip 900. The alternating electric signal is demodulated in a demodulation circuit 912 in a communication circuit unit 905 to be sent to the arithmetic processing circuit 903. The arithmetic processing circuit 903 calls up sensor detected information retained in the memory unit 904 according to the input signal. Then, the signal is sent to a modulation circuit 913 from the arithmetic processing circuit 903 to modulate the signal into an alternating electric signal by the modulation circuit 913. The alternating electric signal 941 is sent to an antenna 921 in the reader/writer 920 via an antenna 902.

The alternating signal received in the antenna 921 in the reader/writer 920 is demodulated by a demodulation circuit 924 in a communication circuit unit 922 to be sent to an arithmetic processing circuit 926 and an external interface unit 927. Then, the sensor detected information is displayed on an information processing apparatus 932 such as a display or a computer connected to the external interface unit 927.

EMBODIMENT 6

The usage of the semiconductor device manufactured according to the present invention is wide-ranging. For example, the semiconductor device can be provided to paper money, coins, securities, bearer bonds, certificates (driver's license, residence certificate, and the like appearing in FIG. 21A), packing containers (wrapping paper, a bottle, and the like appearing in FIG. 21B), a recording medium (DVD software, a video tape, and the like appearing in FIG. 21C), vehicles (a bicycle and the like appearing in FIG. 21D), commodities (a bag, glasses, and the like appearing in FIG. 21E), foods, plants, animals, human bodies, garments, livingware, electronic appliances, and the like. The electronic appliances represent a liquid crystal display device, an EL display device, a television device (also referred to as TV, TV receiver, or television receiver), a cellular phone, and the like.

The semiconductor device is fixated to products by attaching over the surfaces of the products or embedding in the products. For example, the semiconductor device is embedded in a paper of a book or in organic resin of a package made from the organic resin. A counterfeit can be prevented by providing the semiconductor device to the paper money, the coins, the securities, the bearer bonds, the certificates, and the like. The efficiency in an inspection system or a system used in a rental shop can be promoted by providing the semiconductor device to the packing containers, the recording medium, the commodities, the foods, the garment, the livingware, the electronic appliances, and the like. The semiconductor device according to the present invention which is small, thin, and lightweight is not damaged its design even if mounting to a product. Further, providing a plurality of antennas can enlarge the range of choice of a reader/writer. Further, possession of the sensor can control the state of the product.

Figure 22A:
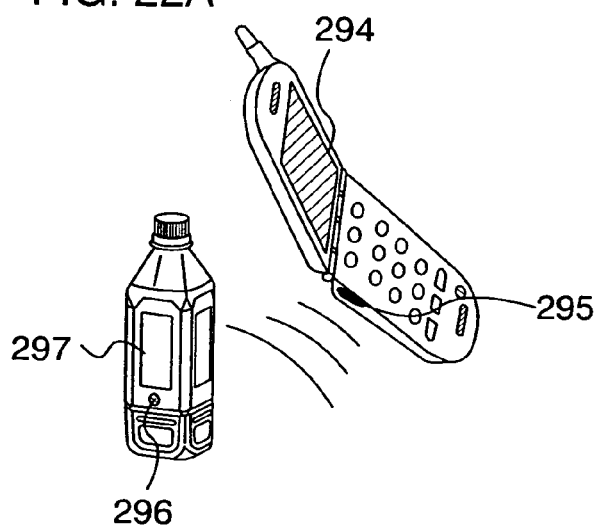
FIGS. 22A and 22B are explanatory views for showing usage patterns of a semiconductor device according to the present invention.
Figure 22B:
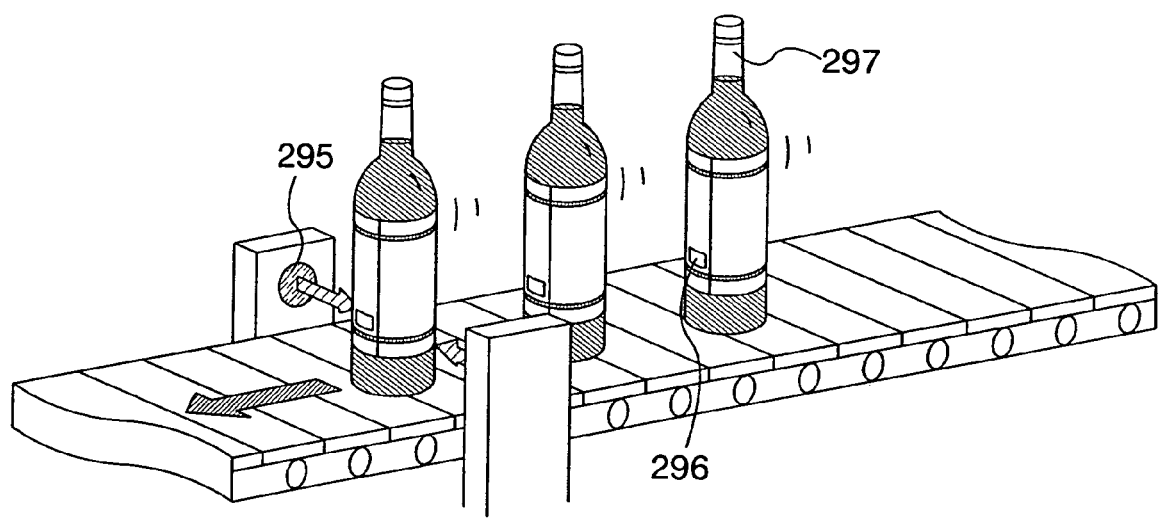

By applying the semiconductor device according to the present invention for a system for logistics or distribution, the system becomes increasingly sophisticated. For example, there is the case that a reader/writer 295 is provided to the side face of a portable terminal having a display portion 294 and a semiconductor device 296 is provided to the side face of a product 297 (refer to FIG. 22A). In that case, information on the raw material, the place of origin, distribution process, and the like of the product 297 can be displayed on the display portion 294 when the reader/writer 295 is held over the semiconductor device 296. Alternatively, there is the case that the reader/writer 295 is provided to the side of a belt conveyor (refer to FIG. 22B). In that case, inspection of the product 297 can be carried out easily.

A typical type of usage of a semiconductor device having the sensor according to the present invention is explained with reference to FIGS. 23A to 23E.

Figure 23A:
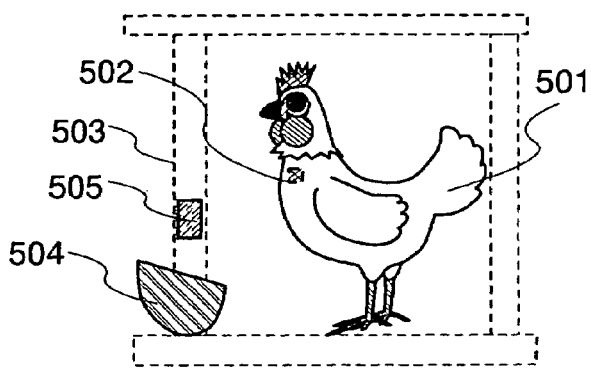
FIGS. 23A to 23E are explanatory views for showing usage patterns of a semiconductor device according to the present invention.

As shown in FIG. 23A, a semiconductor device 502 having a temperature sensor is embedded in an animal 501 to record information on measured temperature of the animal onto a memory unit of the semiconductor device. A reader/writer 505 is provided to installation such as a cage 503 or a feeder 504 at the periphery of the animal to read out information recorded by the reader/writer, accordingly, the health condition of the animal can be readily managed.

Figure 23B:
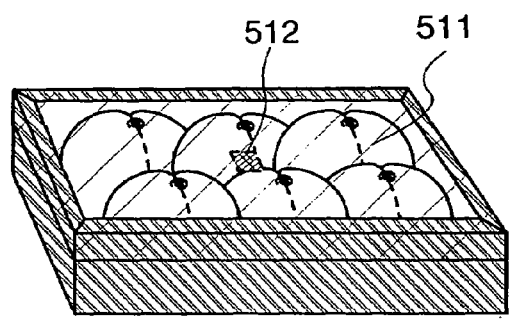

As shown in FIG. 23B, a semiconductor device 512 having a gas sensor is provided to a perishable food 511 to detect putrefaction gas. The reader/writer provided to shelves or the side of a belt conveyor reads out information stored in the semiconductor device, accordingly, the freshness of the food can be managed and a putrefying food can be readily sorted out from the rest.

Figure 23C:
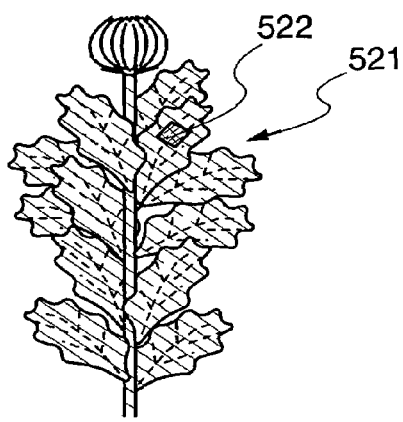

As shown in FIG. 23C, in order to manage flower-bud formation of a long-day plant or a short-day plant, a semiconductor device 522 having an optical sensor is provided to a leaf of a plant 521 in a sunny place to record duration of sunshine onto a memory in a semiconductor device. The recorded information is read out regularly by the reader/writer to control lighting time, accordingly, the time when a plant should bloom and the shipping time of the plant can be readily managed.

Figure 23D:
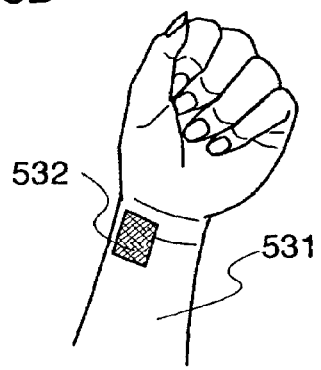
Figure 23E:
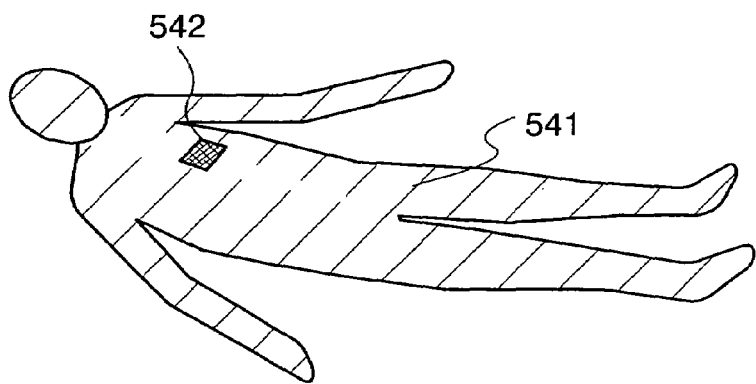

As shown in FIGS. 23D and 23E, semiconductor devices 532, 542 having a sensor such as a temperature sensor or a pressure sensor are provided over the surface or the inside of a human body to record information on a living body such as a pulse rate, a heart rate, body temperature, blood pressure, an electrocardiogram, or an electromyogram. FIG. 23D is a view for showing measurement of the pulse by attaching a semiconductor device having a pressure sensor onto an arm 531. FIG. 23E is a view for showing a measurement of the heart rate by attaching a semiconductor device having a pressure sensor onto the periphery of the heart of a human body 541. The semiconductor device according to the present invention is thin and small, and so information on a living body can be read out without tie-down of the human body. By reading out regularly the recorded information by a reader/writer, health condition or exercise condition of a human body can be managed and diseases can be prevented and predicted. Further, a monitoring system for home-care can be realized by obtaining information on a living body which is read out by a reader/writer using a network such as Internet.

This application is based on Japanese Patent Application serial no. 2004-278548 filed in Japan Patent Office on 2004/9/24, the contents of which are hereby incorporated by reference.

What is claimed is:

1. A method for manufacturing a semiconductor device comprising the steps of:
   selectively forming a release layer over a first substrate;
   forming a first insulating layer over the first substrate with the release layer interposed therebetween;
   forming a plurality of thin film transistors over the first insulating layer;
   forming a second insulating layer over the first insulating layer;
   forming a first opening portion in the first insulating layer and the second insulating layer so that a portion of the first substrate is exposed;
   forming a second opening portion in the second insulating layer so that at least one of source and drain regions of the plurality of thin film transistors is exposed;
   forming a first conductive layer for filling the first opening portion and a second conductive layer for filling the second opening portion;
   forming a third opening portion in the first insulating layer and the second insulating layer to expose a portion of the release layer;
   removing the release layer by introducing etchant into the third opening portion;
   attaching the plurality of thin film transistors to a second substrate so that the second conductive layer is connected to a third conductive layer provided over the second substrate;
   separating the plurality of thin film transistors from the first substrate; and
   attaching the plurality of thin film transistors to a third substrate so that the first conductive layer is connected to a fourth conductive layer provided over the third substrate.

2. The method for manufacturing a semiconductor device according to claim 1, wherein the release layer comprises tungsten or molybdenum.

3. The method for manufacturing a semiconductor device according to claim 1, wherein a layer containing an oxide of tungsten or molybdenum is formed by a sputtering method under oxygen atmosphere as the release layer.

4. The method for manufacturing a semiconductor device according to claim 1, wherein a layer containing tungsten or molybdenum is formed and a layer containing an oxide of silicon is formed thereover as the release layer.

5. The method for manufacturing a semiconductor device according to claim 1, wherein each of the first insulating layer and the second insulating layer comprises silicon.

6. The method for manufacturing a semiconductor device according to claim 1, wherein the etchant is gas or liquid containing halogen fluoride.

7. The method for manufacturing a semiconductor device according to claim 1, wherein the third conductive layer and the fourth conductive layer serve as antennas.

8. The method for manufacturing a semiconductor device according to claim 1, wherein the third conductive layer serves as an antenna and the fourth conductive layer is electrically connected to a sensor.

9. A method for manufacturing a semiconductor device comprising the steps of:
   selectively forming a release layer over a first substrate;
   forming a first insulating layer over the first substrate with the release layer interposed therebetween;
   forming a plurality of thin film transistors over the first insulating layer;
   forming a second insulating layer over the first insulating layer;
   forming a first opening portion in the first insulating layer and the second insulating layer so that a portion of the first substrate is exposed;
   forming a second opening portion in the second insulating layer so that at least one of source and drain regions of the plurality of thin film transistors is exposed;
   forming a first conductive layer for filling the first opening portion and a second conductive layer for filling the second opening portion;
   forming a third opening portion in the first insulating layer and the second insulating layer to expose a portion of the release layer;

selectively removing the release layer by introducing etchant into the third opening portion;

attaching the plurality of thin film transistors to a second substrate so that the second conductive layer is connected to a third conductive layer provided over the second substrate;

separating the plurality of thin film transistors from the first substrate by a physical force; and attaching the plurality of thin film transistors to a third substrate so that the first conductive layer is connected to a fourth conductive layer provided over the third substrate.

10. The method for manufacturing a semiconductor device according to claim 9, wherein the release layer comprises tungsten or molybdenum.

11. The method for manufacturing a semiconductor device according to claim 9, wherein a layer containing an oxide of tungsten or molybdenum is formed by a sputtering method under oxygen atmosphere as the release layer.

12. The method for manufacturing a semiconductor device according to claim 9, wherein a layer containing tungsten or molybdenum is formed and a layer containing an oxide of silicon is formed thereover as the release layer.

13. The method for manufacturing a semiconductor device according to claim 9, wherein each of the first insulating layer and the second insulating layer comprises silicon.

14. The method for manufacturing a semiconductor device according to claim 9, wherein the etchant is gas or liquid containing halogen fluoride.

15. The method for manufacturing a semiconductor device according to claim 9, wherein the third conductive layer and the fourth conductive layer serve as antennas.

16. The method for manufacturing a semiconductor device according to claim 9, wherein the third conductive layer serves as an antenna and the fourth conductive layer is electrically connected to a sensor.

17. A semiconductor device comprising:
a thin film integrated circuit;
a first substrate having a sensor;
a first resin including a first conductive particle between the thin film integrated circuit and the first substrate having the sensor;
a second substrate having an antenna; and
a second resin including a second conductive particle between the thin film integrated circuit and the second substrate having the antenna,
wherein the thin film integrated circuit is interposed between the first substrate having the sensor and the second substrate:having the antenna, and
wherein the thin film integrated circuit is electrically connected to the sensor via the first resin including the first conductive particle and is electrically connected to the antenna via the second resin including the second conductive particle.

18. The semiconductor device according to claim 17, wherein the first substrate and the second substrate have flexibility.

19. An electric appliance having the semiconductor device according to claim 17.

20. A semiconductor device comprising:
a thin film integrated circuit;
a first substrate having a first antenna;
a first resin including a first conductive particle between the thin film integrated circuit and the first substrate having the first antenna;
a second substrate having a second antenna; and
a second resin including a second conductive particle between the thin film integrated circuit and the second substrate having the second antenna,
wherein the thin film integrated circuit is interposed between the first substrate having the first antenna and the second substrate having the second antenna, and
wherein the thin film integrated circuit is electrically connected to the first antenna via the first resin including the first conductive particle and is electrically connected to the second antenna via the second resin including the second conductive particle.

21. The semiconductor device according to claim 20, wherein the first substrate and the second substrate have flexibility.

22. An electric appliance having the semiconductor device according to claim 20.

23. A semiconductor device comprising:
a first conductive layer provided over a first substrate;
a first insulating layer covering the first conductive layer;
a first thin film transistor and a second thin film transistor which are provided over the first insulating layer;
a second insulating layer covering the first thin film transistor and the second thin film transistor;
a second conductive layer and a third conductive layer which are provided over the second insulating layer; and
a fourth conductive layer provided over a second substrate;
wherein the second conductive layer is connected to at least one of source and drain regions of the first thin film transistor via a first opening portion provided in the second insulating layer and to the first conductive layer via a second opening portion provided in the first insulating layer and the second insulating layer, and
the third conductive layer is connected to at least one of source and drain regions of the second thin film transistor via a third opening portion provided in the second insulating layer and to the fourth conductive layer.

24. The semiconductor device according to claim 23, wherein the first conductive layer and the second conductive layer are electrically connected to each other with conductive particles, and the third conductive layer and the fourth conductive layer are electrically connected to each other with conductive particles.

25. The semiconductor device according to claim 23, wherein a first resin including conductive particles is interposed between the first substrate and the first insulating layer, and a second resin including conductive particles is interposed between the second insulating layer and the second substrate.

26. The semiconductor device according to claim 23, wherein the first substrate and the second substrate have flexibility.

27. The semiconductor device according to claim 23, wherein the first conductive layer and the fourth conductive layer serve as antennas.

28. The semiconductor device according to claim 23, wherein the first conductive layer serves as an antenna and the fourth conductive layer is electrically connected to the sensor.

29. The semiconductor device according to claim 23, wherein the second conductive layer has at least a region which is in contact with the first conductive layer via a resin including conductive particles and a region which is in contact with the second insulating layer.

30. The semiconductor device according to claim 23, wherein the first thin film transistor and the second thin film transistor have side wall insulating layers.

31. An electric appliance having the semiconductor device according to claim 23.

* * * * *